US012622125B2

(12) United States Patent
Eperon et al.

(10) Patent No.: US 12,622,125 B2
(45) **Date of Patent: \*May 5, 2026**

(54) INTEGRATED BYPASS DIODE SCHEMES FOR SOLAR MODULES

(71) Applicant: Swift Solar Inc., San Carlos, CA (US)

(72) Inventors: Giles Eperon, Arvada, CO (US); Emmanuel Van Kerschaver, Mountain View, CA (US)

(73) Assignee: Swift Solar Inc., San Carlos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/918,588

(22) Filed: Oct. 17, 2024

(65) Prior Publication Data

US 2025/0037943 A1     Jan. 30, 2025

Related U.S. Application Data

(62) Division of application No. 18/145,819, filed on Dec. 22, 2022, now Pat. No. 12,154,727.

(51) Int. Cl.
| | |
|---|---|
| *H10K 30/30* | (2023.01) |
| *H01G 9/00* | (2006.01) |
| *H01G 9/20* | (2006.01) |
| *H10K 19/20* | (2023.01) |
| *H10K 30/40* | (2023.01) |
| *H10K 30/57* | (2023.01) |

(52) U.S. Cl.
CPC .......... *H10K 30/30* (2023.02); *H01G 9/0036* (2013.01); *H01G 9/2009* (2013.01); *H01G 9/2072* (2013.01); *H01G 9/2081* (2013.01); *H10K 19/20* (2023.02); *H10K 30/40* (2023.02); *H10K 30/57* (2023.02)

(58) Field of Classification Search
CPC ........ H10K 30/30; H10K 30/40; H10K 30/57; H10K 19/20; H01G 9/0036; H01G 9/2009; H01G 9/2072; H01G 9/2081
See application file for complete search history.

(56) References Cited

U.S. PATENT DOCUMENTS

| | | | |
|---|---|---|---|
| 4,956,023 A | 9/1990 | Tsuge et al. |
| 6,690,041 B2 | 2/2004 | Armstrong et al. |

(Continued)

FOREIGN PATENT DOCUMENTS

| | | |
|---|---|---|
| CN | 102637700 A | 8/2012 |
| EP | 1443566 A1 | 8/2004 |

(Continued)

OTHER PUBLICATIONS

Rajagopal et al., "Toward Perovskite Solar Cell Commercialization: A Perspective and Research Roadmap Based on Interfacial Engineering", Adv. Mater. 2018, 30, 1800455. (Year: 2018).*

(Continued)

*Primary Examiner* — Tae-Sik Kang
(74) *Attorney, Agent, or Firm* — Aikin & Gallant, LLP

(57)     ABSTRACT

Hybrid solar cell plates with integrated bypass diodes and modules thereof are described. In an embodiment, a hybrid solar cell plate includes a step surface including a floor and a step edge extending from the floor and across a thickness of a top subcell. A bypass diode is over the floor and laterally adjacent to the step edge.

19 Claims, 21 Drawing Sheets

(56) References Cited

U.S. PATENT DOCUMENTS

| | | | |
|---|---|---|---|
| 10,644,179 | B1 | 5/2020 | Bush |
| 11,329,177 | B2 | 5/2022 | Bush |
| 2001/0023702 | A1 | 9/2001 | Nakagawa et al. |
| 2002/0144724 | A1 | 10/2002 | Kilmer et al. |
| 2002/0164834 | A1 | 11/2002 | Boutros et al. |
| 2005/0121068 | A1 | 6/2005 | Sager et al. |
| 2007/0112884 | A1 | 5/2007 | Kinsey et al. |
| 2010/0282291 | A1 | 11/2010 | Goto et al. |
| 2011/0023954 | A1 | 2/2011 | Jung |
| 2011/0265857 | A1 | 11/2011 | Wang et al. |
| 2011/0284986 | A1 | 11/2011 | Rim et al. |
| 2012/0015472 | A1 | 1/2012 | Hayashi et al. |
| 2012/0055544 | A1 | 3/2012 | Ahn et al. |
| 2013/0008496 | A1 | 1/2013 | Jee |
| 2014/0261657 | A1 | 9/2014 | Cheng et al. |
| 2014/0261674 | A1 | 9/2014 | Youngbull et al. |
| 2015/0007866 | A1 | 1/2015 | Karst et al. |
| 2015/0020864 | A1 | 1/2015 | Dufoureq et al. |
| 2015/0228415 | A1 | 8/2015 | Seok et al. |
| 2015/0236182 | A1 | 8/2015 | Moslehi |
| 2016/0087233 | A1 | 3/2016 | Guha et al. |
| 2016/0196927 | A1 | 7/2016 | Bryant et al. |
| 2016/0233439 | A1 | 8/2016 | Burschka et al. |
| 2017/0033304 | A1 | 2/2017 | Yamamoto et al. |
| 2017/0077344 | A1 | 3/2017 | Youngbull et al. |
| 2017/0077402 | A1 | 3/2017 | Oooka et al. |
| 2017/0194102 | A1 | 7/2017 | Huang et al. |
| 2018/0174761 | A1 | 6/2018 | Kamino et al. |
| 2019/0074461 | A1 | 3/2019 | Ding et al. |
| 2020/0152394 | A1 | 5/2020 | Bush |
| 2020/0152812 | A1 | 5/2020 | Bush |
| 2020/0295209 | A1* | 9/2020 | Bush ........................ H10F 19/35 |
| 2021/0408123 | A1 | 12/2021 | Di Giacomo et al. |

FOREIGN PATENT DOCUMENTS

| | | | |
|---|---|---|---|
| EP | 2224495 | A1 | 9/2010 |
| EP | 3654389 | A1 | 5/2020 |
| JP | 09-064397 | A | 3/1997 |
| JP | 2005268719 | A | 9/2005 |
| JP | 2014179374 | A | 9/2014 |
| KR | 20120028624 | A | 3/2012 |
| KR | 10-2013-0139493 | A | 12/2013 |
| KR | 10-2018-0051019 | A | 5/2018 |
| WO | 2008030019 | A1 | 3/2008 |
| WO | 2016186317 | A1 | 11/2016 |
| WO | 2020101494 | A1 | 5/2020 |

OTHER PUBLICATIONS

International Search Report and Written Opinion in PCT Application No. PCT/US2023/083614, mailed Apr. 23, 2024, 9 pages.

Notification Concerning Transmittal of Copy of International Preliminary Report of Patentability received for PCT Patent Application No. PCT/US2023/083614, mailed on Jul. 3, 2025, 7 pages.

Boyd, Caleb C. et al., "Barrier Design to Prevent Metal-Induced Degradation and Improve Thermal Stability in Perovskite Solar Cells", ACS Energy Letters, 2018, pp. 1772-1778 (7 pgs. total).

Brinkmann, K.O. et al., "Suppressed decomposition of organometal halide perovskites by impermeable electron-extraction layers in inverted solar cells", nature communications, Article, Published Jan. 9, 2017, DOI:10.1038/ncomms13938, 9 pgs.

Bush, Kevin A. et al., "23.6%-efficient monolithic perovskite/silicon tandem solar cells with improved stability", nature energy, published Feb. 17, 2017, vol. 2, Article No. 17009, 7 pgs.

Bush, Kevin A. et al., "Thermal and Environmental Stability of Semi-Transparent Perovskite Solar Cells for Tandems Enabled by a Solution-Processed Nanoparticle Buffer Layer and Sputtered ITO Electrode", Advanced Materials, Materials Views, Communication, published 2016, DOI:10.1002/adma.201505279, pp. 3937-3943 (7 pgs. total).

Cheacharoen, Rongrong et al., "Design and understanding of encapsulated perovskite solar cells to withstand temperature cycling", Royal Society of Chemistry, Paper, Energy & Environmental Science, published Oct. 20, 2017, 7 pgs.

Chen, Han et al., "A solvent-and vacuum-free route to large-area perovskite films for efficient solar modules", Letter, doi:10.1038/nature23877, 2017, vol. 000, 15pgs.

Christians, Jeffrey A. et al., "Stability at Scale: Challenges of Module Interconnects for Perovskite Photovoltaics", ACS Energy Letters, Energy Express, published 2018, DOI:10.11021/acsenergylett.8b01498, pp. 2502-2503 (2 pgs. total).

Crozier, M.L. et al., "Recent developments toward a one step thin-film PV interconnection process using laser scribing and inkjet printing", ResearchGate, Conference Paper, published Jun. 2014, DOI:10.1109/PVSC.2014.6925507, pp. 2784-2788 (6 pgs. total).

Domanski, Konrad et al., "Not All That Glitters Is Gold: Metal-Migration-Induced Degradation in Perovskite Solar Cells", ACS Nano, Article, published 2016, DOI:10.1021/acsnano.6b02613, pp. 6306-6314 (9 pgs. total).

Dongaonkar, S. et al. "Performance and Reliability Implications of Two-Dimensional Shading in Monolithic Thin-Film Photovoltaic Modules," IEEE Journal of Photovoltaics, vol. 3, No. 4, Oct. 2013, pp. 1367-1375, 9 pgs. total.

Eperon, Giles E. et al., "Perovskite-perovskite tandem photovoltaics with optimized bandgaps", ResearchGap, Article in Science, Oct. 2016, DOI:10.1126/science.aaf9717, 10 pgs.

Fields, J.D. et al., "Printed interconnects for photovoltaic modules", Elsevier, Solar Energy Materials & Solar Cells 159 (2017) pp. 536-545, (10 pgs. total).

Gehlhaar, Robert et al., (2015). "Perovskite solar modules with minimal area loss interconnections", SPIE Newsroom. 10.1117/2.1201509.006116., 3 pgs.

Grancini, G. et al., "One-Year stable perovskite solar cells by 2D/3D interface engineering", nature communications, Article, published Jun. 1, 2017, DOI:10.1038/ncomms15684, 8 pgs.

Heise, Gerhard et al., "Monolithical Serial Interconnects of Large CIS Solar Cells with Picosecond Laser Pulses", Elsevier, Physics Procedia, ScienceDirect, LiM 2011, pp. 149-155 (7 pgs. total).

Horowitz, Kelsey A.W. et al., "An analysis of glass-glass CIGS manufacturing costs", Elsevier, Solar Energy Materials & Solar Cells 154, 2016, 10 pgs.

Jacobs, Daniel A. et al., "A re-evaluation of transparent conductor requirements for thin-film solar cells", Royal Society of Chemistry, Paper, Journal of Materials Chemistry A, published Feb. 25, 2016, pp. 4490-4496 (7 pgs. total).

Jin et al., "High temperature coefficient of resistance molybdenum oxide and nickel oxide thin films for microbolometer applications", Optical Engineering 54(3), 037101-1-037101-6 (Mar. 2015).

Jones-Albertus, Rebecca et al., "Technology advances needed for photovoltaics to achive widespread grid price parity", Progress in Photovoltaics, piblished 2016, DOI:10.1002/pip.2755, pp. 1272-1283 (12 pgs. total).

Kaltenbrunner, Martin, "Flexible high power-per-weight perovskite solar cells with chromium oxide-metal contacts for improved stability in air", nature materials, published Aug. 24, 2015, DOI:10.1038/NMAT4388, pp. 1032-1041 (10 pgs. total).

Kato, Yuichi et al., "Silver Iodide Formation in Methyl Ammonium Lead Iodide Perovskite Solar Cells with Silver Top Electrodes", Advanced Materials Interfaces, Full Paper, published 2015, 6 pgs.

Leijtens, Thomas et al., "Opportunities and challenges for tandem solar cells using metal halide perovskite semiconductors," Nature Energy 3, 828-838 (2018) https://doi.org/10.1038/s41560-018-0190-4, 11 pages.

Li, Zhen et al., "Scalable fabrication of perovskite solar cells", Nature Reviews, Materials, vol. 3, Article No. 18017, published online Mar. 27, 2018, doi:10.1038/naturevmats.2018.17, 20 pgs.

Palma, Alessandro Lorenzo et al., "Laser-Patterning Engineering for Perovskite Solar Modules With 95% Aperture Ratio", IEEE Journal of Photovoltaics, published 2017, 7 pgs.

Pisoni, Stefano et al., "Impact of interlayer application on band bending for improved electron extraction for efficient flexible perovskite mini-modules", Elsevier, Nano Energy, published 2018, pp. 300-307 (8 pages. total).

(56)     References Cited

OTHER PUBLICATIONS

Powalla, Dr.-ing.Michael, "Development of Materials and Processes for the Production of Solar Modules, The Sequence of Processing Steps for the Production of a Cu(In, Ga)Se2 Thin-Film Solar Module", Zentrum fur Sonnenenergie-und Wasserstoff-Forschung (ZSW), Jun. 2008, Germany, 1 pg.

Rowell, Michael W., et al., "Transparent electrode requirements for thin film solar cell modules", Energy & Environmental Science, Communication, Published on Nov. 5, 2010, The Royal Society of Chemistry, DOI:10.1039/c0ee00373e, 4 pgs.

Saha, B. et al. "Schottky diode behaviour with excellent photoresponse in NiO/FTO heterostructure", Applied Surface Science 418 (2017), Elsevier, pp. 328-334, 7 pgs. total.

Sanehira et al., "Influence of Electrode Interfaces on the Stability of Perovskite Solar Cells: Reduced Degradation Using MoOx/Al for Hole Collection", ACS Energy Lett. 2016, 1, 38-45. (Year: 2016).

Silverman, Timothy J., et al., "Thermal and Electrical Effects of Partial Shade in Monolithic Thin-Film Photovoltaic Modules" IEEE Journal of Photovoltaics, vol. 5, No. 6, Nov. 2015, 6 pages.

Silvestre, S., et al. "Study of Bypass Diodes Configuration on PV Modules" Applied Energy 86, (2009), Elsevier, pp. 1632-1640, 9 pgs. total.

Song, Zhaoning et al., "A technoeconomic analysis of perovskite solar module manufacturing with low-cost materials and techniques", Royal Society of Chemistry, Analysis, Energy & Environmental Science, published May 12, 2017, pp. 1297-1305 (13 pgs. total).

Steim, Roland et al. "Flexible polymer photovoltaic modules with incorporated organic bypass diodes to address module shading effects", Solar Energy Materials & Solar Cells 93 (2009), Elsevier, pp. 1963-1967, 5 pgs. total.

Unknown Author, "Module Shading Guide" First Solar, Inc., 2017, PD-5-367 Rev. 1.0, 8 pages.

Wilkinson, Ben et al. "Scaling limits to large area perovskite solar cell efficiency" EU PVSEC Paper, Wiley, Progress in Photovoltaics, Mar. 16, 2018, pp. 659-674, 16 pgs. total.

Yang, Mengjin et al., "Highly Efficient Perovskite Solar Modules by Scalable Fabrication and Interconnection Optimization", ACS Energy Letters, Letter, published 2018, pp. 322-328 (7 pgs. total).

You, Jingbi et al., "Improved air stability of perovskite solar cells via solution-processed metal oxide transport layers", nature nanotechnology, Articles, vol. 11, published online: Oct. 12, 2015, DOI:10.1038/NNANO.2015.230, pp. 75-82 (8 pgs. total).

Bermudez Veronica et al: "Understanding the cell-to-module efficiency gap in Cu(In,Ga) (S,Se)2 photovoltaics scale-up", Nature Energy, Nature Publishing Group UK, London, vol. 3, No. 6, Jun. 8, 2018 (Jun. 8, 2018), pp. 466-475.

Ephraim Trinidad, "Evaluation of Hybrid Electrically Conductive Adhesives" Received from https://uwspace.uwaterloo.ca/handle/10012/10991, University of Waterloo, 2016, 125 pages.

Huang et al., "Thermal properties of polyvinyl butyral/graphene composites ass encapsulation materials for solar cells", Solar Energy 161 (2018) 187-193. (Year: 2018).

* cited by examiner

125

| | |
|---|---|
| Metal Fingers | 150 |
| Electrode | 140 |
| Buffer | 136 |
| ETL | 134 |
| Absorber | 132 |
| HTL | 130 |
| Recombination Layer | 120 |
| ETL | 134 |
| Absorber | 132 |
| HTL | 130 |
| Electrode | 102 |
| Substrate | 101 |

125

| | |
|---|---|
| Metal Fingers | 150 |
| Electrode | 140 |
| ETL | 134 |
| Absorber | 132 |
| HTL | 130 |
| Recombination Layer | 120 |
| n+-Si | 112 |
| p-Si | 110 |
| Electrode | 102 |

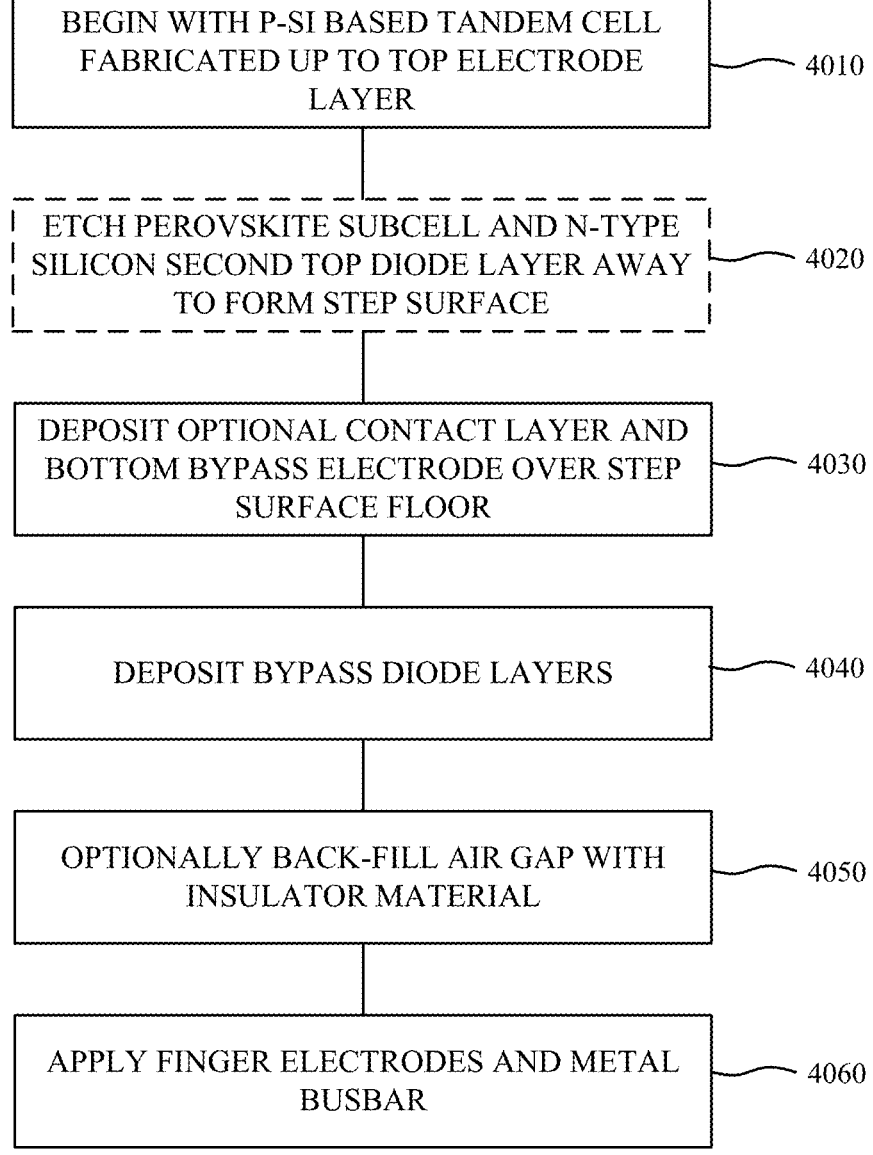

| BEGIN WITH P-SI BASED TANDEM CELL FABRICATED UP TO TOP ELECTRODE LAYER | 4010 |

ETCH PEROVSKITE SUBCELL AND N-TYPE SILICON SECOND TOP DIODE LAYER AWAY TO FORM STEP SURFACE — 4020

DEPOSIT OPTIONAL CONTACT LAYER AND BOTTOM BYPASS ELECTRODE OVER STEP SURFACE FLOOR — 4030

DEPOSIT BYPASS DIODE LAYERS — 4040

OPTIONALLY BACK-FILL AIR GAP WITH INSULATOR MATERIAL — 4050

APPLY FINGER ELECTRODES AND METAL BUSBAR — 4060

*FIG. 4*

INTEGRATED BYPASS DIODE SCHEMES FOR SOLAR MODULES

RELATED APPLICATIONS

This application is a divisional of co-pending U.S. application Ser. No. 18/145,819 filed Dec. 22, 2022, which is incorporated herein by reference.

BACKGROUND

Field

Embodiments described herein relate to solar cells, and more particularly to integration of bypass diodes for solar modules.

Background Information

Photovoltaic cells, also referred to solar cells, are devices that convert radiant photo energy into electrical energy. Multiple solar cells may be integrated into a group to constitute a solar panel, or module, in which the solar cells are usually connected in series creating an additive voltage.

Reverse bypass diodes may also be included in some implementations to provide operational stability to a photovoltaic module. For example, shading of a solar cell wired in series within a string of solar cells can force the cell into reverse bias, causing hot-spot heating which may lead to detrimental effects such as cracking, shorting, or delamination. A bypass diode can limit the reverse bias voltage a shaded solar cell experiences, thus preventing the creation of such hot-spots.

Conventional silicon solar cells are connected and placed into modules in two main ways. In a first implementation full or half cells are connected by soldering wires or flat busbar ribbons to the front of the solar cell, and specifically to screen printed metal fingers. The attached busbar is longer than the cell and can make contact to the back of the next cell in a series connection. In another implementation smaller cells are connected in series through a process in which the top of one cell is placed under the next cell and so on, allowing the positive terminal of one cell to contact the negative terminal of the next cell, or vice versa depending on the type of solar cell used.

Bypass diodes may generally be soldered into a photovoltaic array during module layup and packaging. For a silicon solar cell array, only a few bypass diodes are required to ensure operational stability and prevent damage from hot-spots because of the high reverse bias breakdown voltage of silicon solar cells. Specifically, the bypass diodes are added at the edge of the photovoltaic module and connected in parallel to a string, or strings, of solar cells, with an opposite polarity to the solar cells. If one or more of the solar cells in a serially connected string is shaded, they could be put in reverse bias. In this case, the bypass diode that is wired in parallel to the string is put into forward bias to allow the flow of current over some threshold voltage, essentially allowing current to flow around the string including the shaded solar cell(s).

SUMMARY

Hybrid solar cell plates and modules thereof are described in which the hybrid solar cell plates include solar cells with integrated bypass diodes. In an embodiment, a hybrid solar cell plate includes a bottom electrode layer, a top electrode layer, and a top subcell between the bottom electrode layer and the top electrode layer. The top subcell may include a first bottom junction layer of a first carrier type (e.g. hole or electron), and a first top junction layer of a second carrier type (e.g. hole or electron) opposite the first carrier type. The hybrid solar cell plate additionally includes a step surface including a floor and a step edge extending from the floor and across a thickness of the top subcell. In accordance with embodiments, a bypass diode is over the floor and laterally adjacent to the step edge. An insulator material or air gap may be located laterally between the bypass diode and the top subcell to prevent shorting. The step surface in accordance with embodiments may assume a variety of configurations, including a trench within the top subcell or ledge. In accordance with embodiments, the bottom electrode layer spans underneath the bypass diode (and floor) to make back side electrical connection with both the solar cell and bypass diode of the hybrid solar cell plate.

Top side electrical connection may include a plurality of metal finger electrodes spanning over the top subcell and a metal busbar substantially located over the floor of the step surface. In this manner, the step surface can both accommodate the bypass diode and provide an area over which the metal busbar can be located without blocking light transmission to the top subcell. In accordance with embodiments, the step edge is adjacent to and parallel to a peripheral edge of the hybrid solar cell plate, which can facilitate serial connection, the top subcell is portion of an only solar cell of the hybrid solar cell plate, and the bypass diode is an only bypass diode of the hybrid solar cell plate.

The hybrid solar cell plates in accordance with embodiments can be fabricated with single junction (single subcell) and multiple junction (multiple subcell) solar cells, and with various geometries and polarities. In various tandem solar cell stack-ups the hybrid solar cell plate can additionally include a bottom subcell including a second bottom junction layer of the first carrier type, and a second top junction layer of the second carrier type opposite the first carrier type.

In an exemplary tandem solar cell stack-up the step edge extends across a thickness of the second top junction layer (of the bottom subcell) and the bypass diode is formed on top of the second bottom junction layer (of the bottom subcell). In this configuration the bypass diode bypasses both the top subcell and the bottom subcell. The second bottom junction layer can function as a junction layer for the solar cell portion, and electrical conduit for back side contact to the bottom electrode layer for the bypass diode. Furthermore, where the second bottom junction layer is formed from a base silicon substrate, this layer can additionally provide structural robustness for the hybrid solar cell plate.

In another exemplary tandem solar cell stack-up the step edge extends across a thickness of the top subcell and the bypass diode is on top of the second top junction layer of the bottom subcell. In this configuration the bypass diode bypasses only the top subcell.

In other configurations the solar cell stack-up is a single junction structure, including only the top subcell. In an embodiment, the step edge extends across a thickness of the first bottom junction layer and the first top junction layer. In an embodiment, the step edge extends across a thickness of the first top junction layer, and the floor of the step surface spans over the first bottom junction layer. In the later configuration the first bottom junction layer also functions as an electrical conduit for back side contact to the bottom electrode layer for the bypass diode.

In yet another configuration the bypass diode can be formed over the solar cell and the step surface. In an embodiment, a hybrid solar cell plate includes a bottom electrode layer, a top electrode layer, and a top subcell between the bottom electrode layer and the top electrode layer. The top subcell may include a first bottom junction layer of a first carrier type (e.g. hole or electron), and a first top junction layer of a second carrier type opposite the first carrier type. The hybrid solar cell plate additionally includes a step edge including a floor and a step edge that extends from the floor and across a thickness of the top subcell. In an embodiment, the bypass diode is over both the floor and the top subcell. Similar to other embodiments, a plurality of metal finger electrodes can span over the top subcell, while a metal busbar is substantially located over the floor. The bypass diode can also be characterized by a finger and busbar pattern underlying a portion of the plurality of metal finger electrodes and the metal busbar so as to provide additional bypass diode area, but not completely cover the light transmission to the top subcell. In an embodiment, the hybrid solar cell plate can additionally include a bottom subcell including a second bottom junction layer of the first carrier type, and a second top junction layer of the second carrier type opposite the first carrier type. In an exemplary tandem solar cell stack-up the step edge extends across a thickness of the second top junction layer (of the bottom subcell) and the bypass diode is formed on top of the second bottom junction layer (of the bottom subcell). In this configuration the bypass diode bypasses both the top subcell and the bottom subcell. The second bottom junction layer can function as a junction layer for the solar cell portion, and electrical conduit for back side contact to the bottom electrode layer for the bypass diode. Furthermore, where the second bottom junction layer is formed from a base silicon substrate, this layer can additionally provide structural robustness for the hybrid solar cell plate.

The various hybrid solar cell plates in accordance with embodiments can be serially connected in solar modules in accordance with embodiments, with the metal busbars of one hybrid solar cell plate being serially connected to the bottom electrode layer of the next hybrid solar cell plate, and so forth. In an embodiment, a solar module includes a first hybrid solar cell plate and a second hybrid solar cell plate. The first hybrid solar cell plate may include a first top subcell, a first step surface including a first floor and a first step edge extending from the first floor across a first thickness of the first top subcell, a first bypass diode over the first floor, a first plurality of metal finger electrodes spanning over the first top subcell, a first metal busbar over the first bypass diode, and a first bottom electrode layer. The second hybrid solar cell plate may include a second top subcell, a second step surface including a second floor and a second step edge extending from the second floor across a second thickness of the second top subcell, a second bypass diode over the first floor, a second plurality of metal finger electrodes spanning over the second top subcell, a second metal busbar over the second bypass diode, and a second bottom electrode layer. In an embodiment, the first metal busbar is connected to the second bottom electrode layer with a ribbon or wiring. In an embodiment, the first metal busbar is connected to the second bottom electrode layer with a conductive film, conductive paste, or solder which can be used to directly connect the two hybrid solar cell plates, or to attach the ribbon or wiring to one or both of the hybrid solar cell plates.

BRIEF DESCRIPTION OF THE DRAWINGS

FIG. 4 is a flow chart for a method of forming a hybrid solar cell plate including a perovskite-silicon tandem solar cell with integrated bypass diode in accordance with an embodiment.

DETAILED DESCRIPTION

Figure 1A:
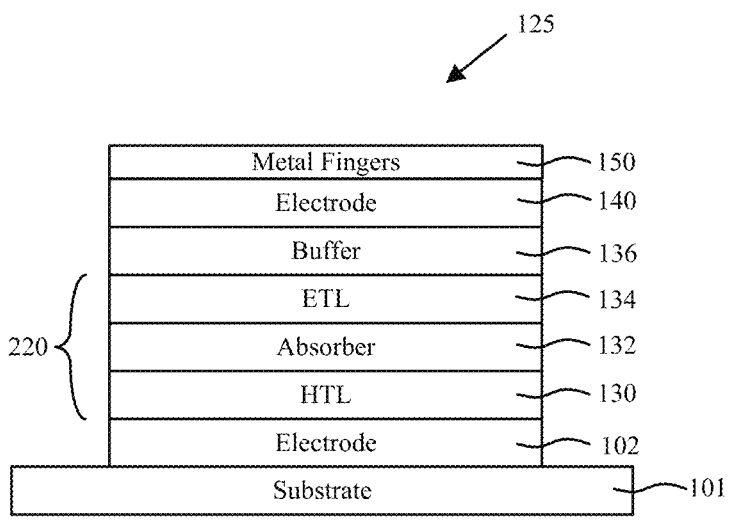
FIG. 1A is an illustrative diagram of solar cell stack-up in accordance with an embodiment.

Embodiments describe hybrid solar cell plate structures and modules thereof in which the hybrid solar cell plate structures include solar cells with integrated bypass diodes. The solar cells may be single junction or multi-junction structures, where the bypass diodes can be designed to interact with only a single subcell or multiple stacked subcells. In an embodiment, a step surface such as a trench, ledge, etc. is fabricated in the hybrid solar cell plate structure in order to integrate the bypass diode laterally adjacent to at least one subcell of the solar cell stack-up. In this manner the bypass diode can be integrated to bypass one or all of the subcells.

In one aspect, the integration techniques in accordance with embodiments for the bypass diode allows for direct integration of the bypass diode with the solar cell as opposed to as a discrete component. In another aspect, the area of the step surface used for the bypass diode can accommodate metal busbar formation that does not block the solar cell and provides a surface for serial interconnection with other hybrid solar cell plates. Furthermore, using the step surface for connection between multiple panels can mitigate the transfer of bonding pressure to an underlying solar cell, and more particularly to an absorber layer, such as a perovskite layer, that can be susceptible to mechanical deformation, and hence device degradation.

In various embodiments, description is made with reference to figures. For example, hybrid solar cell plate structures are described with tandem solar cells (e.g. perovskite-silicon) and single junction solar cells (e.g. perovskite, silicon). Hybrid solar cell plate structures are additionally described in which the bypass diodes may bypass a single subcell, or both subcells in a tandem stack. Furthermore, stack-ups with particular polarities and diode geometries (e.g. n-i-p, p-i-n, n-p, p-n, etc.) are described. It is to be appreciated that certain embodiments may be practiced with other materials systems, or in combination with other known methods, configurations, geometries and polarities.

In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIGS. 1A-ID various solar cell stack-ups are illustrated and described that may be integrated into the hybrid solar cell plate structures in accordance with embodiments. In the following description various layers and compositions are described for the solar cell stack-ups. It is to be appreciated that each layer may include a single layer, or multiple layers. Furthermore, reference to bottom or top layers herein is relative and may not be reflective of actual orientation in product. In addition, while specific stack-ups are described and illustrated with regard to particular orientation (e.g., p-i-n, p-n, etc.) the order of the junction layers (e.g. n-doped layers, p-doped layers, electron transport layer, hole transport layers) may also be flipped in accordance with embodiments. These changes in order of layer formation can additionally change materials selection of some layers without straying from the principles of the embodiments. Thus, reference to n-doped and p-doped layers, or electron transport layer (ETL) and hole transport layer (HTL) may be reversed in accordance with embodiments.

Figure 1B:
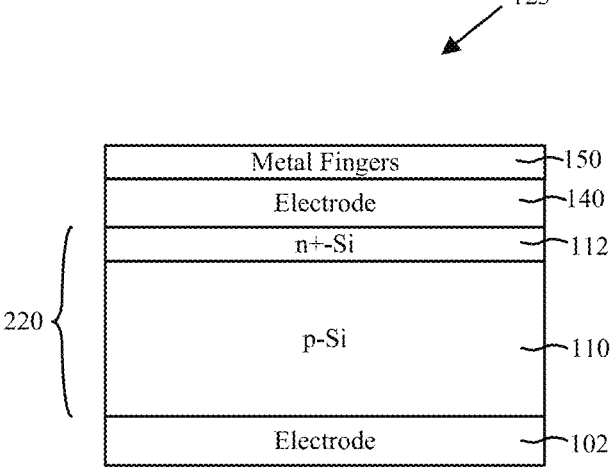
FIG. 1B is an illustrative diagram of solar cell stack-up in accordance with an embodiment.

Referring now to FIGS. 1A-1B, FIG. 1A is illustrative of a p-i-n solar cell stack-up, while FIG. 1B is illustrative of a p-n solar cell stack-up. In the particular embodiment illustrated in FIGS. 1A, the solar cell 125 may absorb light from the top side, for example through a patterned metal layer 150, such as metal finger and busbar pattern, and underlying (transparent) electrode layer 140. Alternatively, the solar cell 125 can absorb light from the bottom side of the illustrated stack-up, for example through a transparent substrate 101. Substrate 101 may be rigid or flexible. For example, a substrate 101 can include a permanent or temporary carrier such as glass and top (flexible) polymer adhesion layer.

As illustrated, the solar cell 125 may include a bottom electrode layer 102 formed on the substrate 101, a top electrode layer 140, and a top subcell 220 between the bottom and top electrode layers. Additionally, a buffer layer 136 may optionally be formed on top subcell 220 (e.g. by chemical vapor deposition or atomic layer deposition). The buffer layer 136 may additionally function as a charge transport layer. In the particular embodiment illustrated, the buffer layer 136 can function as both a barrier layer and charge transport layer. The top subcell 220 includes an absorber layer 132 and one or more junction layers of opposite carrier type (e.g. hole or electron). As used herein, the term "carrier type" as used to described a junction layer refers to a primary carrier type, inclusive of intrinsic properties and intentional primary dopant type (e.g. p-dopant, n-dopant) to achieve primary hole or electron transfer through the layer in operation of the solar cell or bypass diode. Thus, "carrier type" refers to the primary carrier (hole or electron) for the material.

In the embodiment illustrated, the top subcell 220 includes a bottom junction layer 130 of first carrier type, such as a hole transport layer (HTL) over the bottom electrode layer 102, an absorber layer 132 over the bottom junction layer 130, and a top junction layer 134 of second carrier type opposite the first carrier type, such as an electron transport layer (ETL), over the absorber layer 132. The buffer layer 136 may also function as an ETL in this configuration, and physically separate the top electrode layer 140 from top subcell 220, and specifically from the absorber layer 132.

In an embodiment, the bottom electrode layer 102 can be formed of a transparent material. Exemplary transparent bottom electrode materials include poly(3,4-ethylenedioxythiophene) polystyrene sulfonate (PEDOT:PSS), transparent conductive oxides (TCOs) such as indium tin oxide (ITO), fluorine doped tin oxide (FTO), indium zinc oxide (IZO), aluminum doped zinc oxide (AZO), cadmium stannate, etc. Alternatively, the bottom electrode layer 102 includes one or more metal layers, such as Ag, Cr, Au, Cu, Al, etc. The bottom electrode layer 102 may include a combination of metal layer(s) and TCO layer(s). Bottom electrode layer 102 may be any suitable contact material such as aluminum back surface field (Al-BSF), passivated emitter rear contacts (PERC), tunnel oxide passivated contacts (TOPCON), heterojunction contacts (amorphous silicon, nanocrystalline silicon), etc.

An exemplary HTL may include one or more layers formed of a metal oxide such as nickel oxide (NiOx) or vanadium oxide ($V_2O_5$), an organic polymer such as poly (triaryl amine) (PTAA) or small molecules such as 2,2',7, 7'-Tetrakis [N,N-di(4-methoxyphenyl)amino]-9,9'-spirobifluorene (spiro-MeOTAD). The HTL may additionally be doped with to increase conductivity, and may include a bi-layer of a metal oxide and an organic layer on top.

The absorber layer 132 in accordance with embodiments may be formed of a perovskite material. Perovskite materials may be characterized by the formula $ABX_3$, with A representing a large atomic or molecular cation (e.g. Cs, methylammonium, formamidinium, etc.), with B representing a positively charged cation (e.g. metal, lead, plumbate, Sn), and X representing a negatively charged anion (e.g. halide, I, Br, Cl). Perovskite materials can also include a mixture of 2D and 3D structures in the family of $A^1{}_mA_nB_{n-1}X_{3n-1}$ where $A^1$ represents a positively charged cation (eg butylammonium, phenethylammonium, guanidinium, etc.) Alternative materials such as organic materials can also be used as the absorber layer.

An exemplary ETL in accordance with embodiments can be formed of fullerene or a fullerene and metal halide bi-layer. The buffer layer 136 in accordance with embodiments may be formed of an n-type metal oxide such as tin oxide or aluminum zinc oxide (AZO) over the fullerene layer.

In an embodiment, the top electrode layer 140 includes one or more metal layers, such as Ag, Cr, Au, Cu, Al, etc. Alternatively, the top electrode layer 140 may be formed of a transparent conducting layer such as poly(3,4-ethylenedioxythiophene) polystyrene sulfonate (PEDOT:PSS), transparent conductive oxides (TCOs) such as indium tin oxide (ITO), fluorine doped tin oxide (FTO), indium zinc oxide (IZO), aluminum doped zinc oxide (AZO), cadmium stannate, etc. A patterned metal layer 150 may then be formed over the transparent top electrode layer 140, for example to facilitate charge transport. In an embodiment, the patterned metal layer 150 is formed of a suitable material such as Ag, Cr, Au, Cu, Al, etc. The patterned metal layer 150 may be formed in the shape of finger electrodes and busbar so as to transport charge without overly blocking light transmission.

Referring now to the embodiment illustrated in FIG. 1B, a p-n solar cell stack-up is shown. For example, this may be achieved with silicon materials, though is not so limited. As shown, the solar cell 125 stack-up may include a bottom electrode layer 102, and a top subcell 220 including a bottom junction layer 110 of first conductivity type (e.g. a p-doped silicon layer for hole conductivity), and a top junction layer 112 of second conductivity type (e.g. an n+ doped silicon layer for electron conductivity). Exemplary p-dopants for silicon include B, Al, In, etc. Exemplary n-dopants for silicon include P, Sb, As, etc. Additional dopants are possible, and specific dopants may change for other base semiconductor materials, GaAs, GaP, GaN, CdTe, CdS, etc. A top electrode layer 150 and patterned metal layer 150 may be formed as previously described.

Figure 1C:
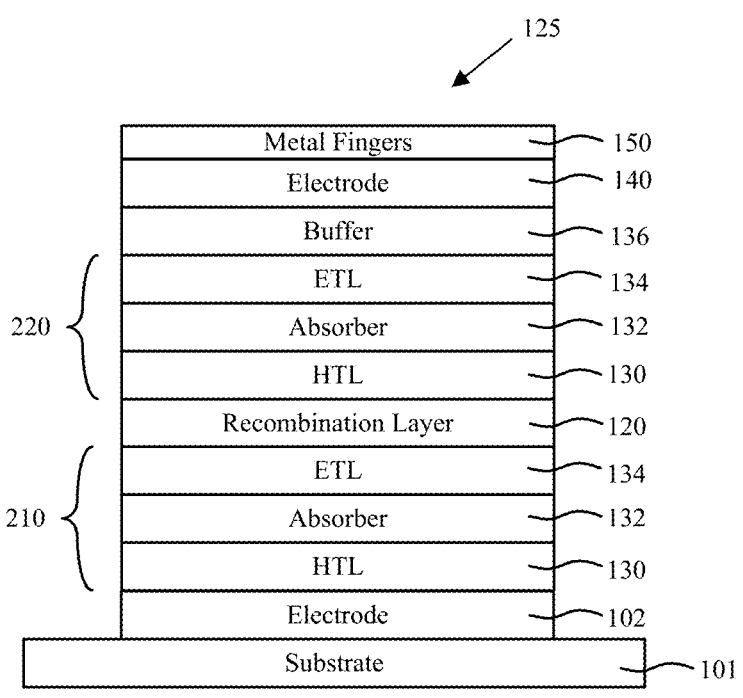
FIG. 1C is an illustrative diagram of a tandem solar cell stack-up in accordance with an embodiment.

FIG. 1C is an illustrative diagram of a tandem solar cell stack-up in accordance with embodiments. The tandem structure may include multiple absorber layers, which may be the same or different materials. In the specific embodiment described the tandem structure is a perovskite-perovskite tandem structure, though embodiments are not so limited. Bottom junction layer 130 (e.g. HTL), absorber layer 132, and top junction layer 134 (e.g. ETL) for the stacked bottom subcells 210 and top subcells 220 may be similar as described with regard to FIG. 1A. Notably, while absorber layers 132 may be formed of similar perovskite-based materials, they may be tuned for different bandgaps. One or more of the absorber layers may also be formed of an organic material. A recombination layer 120 may be located between the stacked subcells 210, 220 between a top junction layer 134 and bottom junction layer 130. Recombination layer 120 may be a transparent conducting layer such as a TCO, or ITO specifically. Buffer layer 136 and top electrode layer 140 may additionally be formed similarly as with regard to FIG. 1A.

Figure 1D:
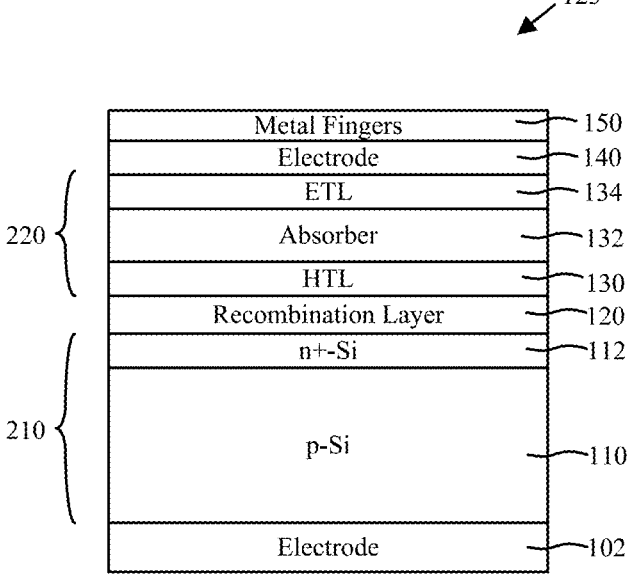
FIG. 1D is an illustrative diagram of a silicon-perovskite tandem solar cell stack-up in accordance with an embodiment.

FIG. 1D is an illustrative diagram of an alternative tandem solar cell stack-up in accordance with embodiments. In particular, FIG. 1D illustrates a tandem solar cell stack-up of the subcells of FIGS. 1A-1B in accordance with embodiments. For example, this may be a silicon-perovskite tandem solar cell, though embodiments are not so limited. The tandem solar cell stack-up may absorb light from the top side. The top subcell 220 may include a bottom junction layer 130 (e.g. HTL), absorber layer 132, and top junction layer 134 (e.g. ETL) similarly as described with regard to FIG. 1A. Such a top perovskite subcell 220 may be formed on a silicon bottom subcell 210 including a bottom junction layer 110 (e.g. p-doped silicon layer) and top junction layer 112 (e.g. n-doped silicon layer) similarly as described with regard to FIG. 1B. A recombination layer 120 can be located between the subcells 220. The recombination layer 120 may be formed of a transparent material. Since the silicon part may be opaque, the top electrode layer 140 may be formed of a transparent conducting layer such as poly(3,4-ethylenedioxythiophenc) polystyrene sulfonate (PEDOT:PSS), transparent conductive oxides (TCOs) such as indium tin oxide (ITO), fluorine doped tin oxide (FTO), indium zinc oxide (IZO), aluminum doped zinc oxide (AZO), cadmium stannate, etc. A patterned metal layer 150 may then be formed over the transparent top electrode layer 140, for example to facilitate charge transport. In an embodiment, the patterned metal layer 150 is formed of a suitable material such as Ag, Cr, Au, Cu, Al, etc. The patterned metal layer 150 may be formed in the shape of finger electrodes and busbar so as to transport charge without overly blocking light transmission. A bottom electrode layer 102 may also be formed underneath the p-doped silicon layer 110. Bottom electrode layer 102 may be formed of a suitable material such as Ag, Cr, Au, Cu, Al, etc. Bottom electrode layer 102 may be any suitable contact material such as aluminum back surface field (Al-BSF), passivated emitter rear contacts (PERC), tunnel oxide passivated contacts (TOPCON), heterojunction contacts (amorphous silicon, nanocrystalline silicon), etc.

In each of the previous embodiments described with regard to FIGS. 1A-ID specific stack-ups are described and illustrated with a p-i-n or p-n orientation, though the order of junction layers may also be flipped in accordance with embodiments. These changes in order of layer formation can additionally change materials selection of some layers without straying from the principles of the embodiments. Thus, reference to n-doped and p-doped layers, or ETL and HTL may be reversed in accordance with embodiments.

Referring now to FIGS. 2-17 hybrid solar cell plate structures are described in which bypass diodes are integrated with the solar cell structures. Furthermore, solar modules are described in which the hybrid solar cell plate structures can be connected in series utilizing the area occupied by the bypass diodes for interconnection between the hybrid structures. Thus, each hybrid solar cell plate 100 can be a discrete substrate, with a solar module including a plurality of connected hybrid solar cell plates 100. In the following description, various single junction and multi-junction structures are described as well as various orders of the junction layers. It is to be appreciated that embodiments are not limited to the specific illustrations, and that in interest of conciseness further variations are not illustrated. Furthermore, embodiments are not strictly limited to the particular layer stack-ups and that additional layers may be included, or some layers may be optional in some embodiments.

Figure 2:
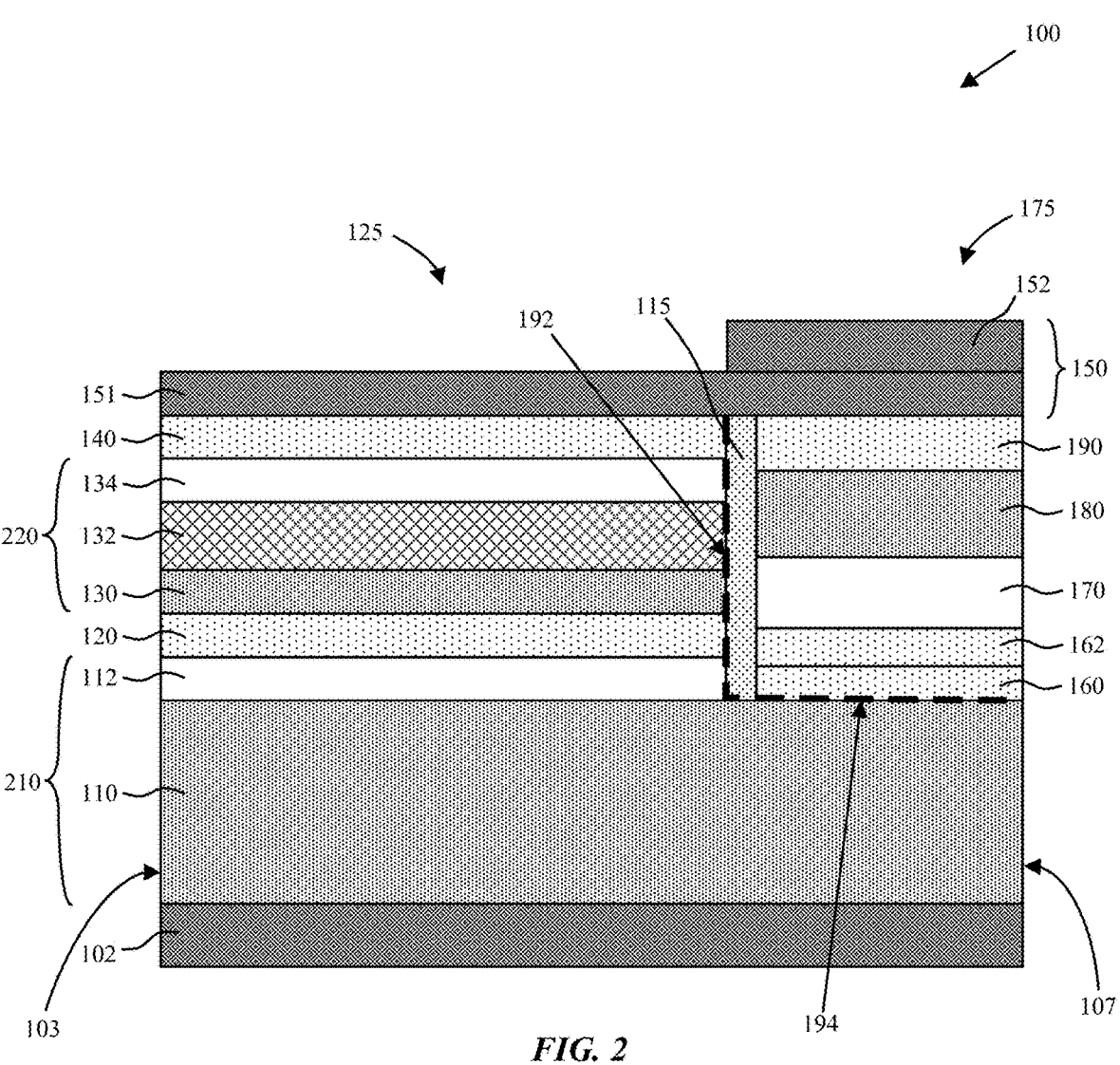
FIG. 2 is a schematic cross-sectional side view illustration of a hybrid solar cell plate including a p-silicon based perovskite-silicon tandem solar cell with p-i-n perovskite geometry with integrated bypass diode to both subcells in accordance with an embodiment.

FIG. 2 is a schematic cross-sectional side view illustration of a hybrid solar cell plate 100 including a p-silicon based perovskite-silicon tandem solar cell 125 with p-i-n perovskite geometry and integrated bypass diode 175 to both subcells in accordance with an embodiment. The solar cell 125 may be similar to that illustrated and described with regard to FIG. 1D. In the illustrated embodiment the hybrid solar cell plate 100 includes a bottom electrode layer 102, a top electrode layer 140 and a top subcell 220. The top subcell 220 may include a first bottom junction layer 130 of a first carrier type (e.g. HTL) and a first top junction layer 134 of a second carrier type (e.g. ETL) opposite the first carrier type. An absorber layer 132 such as a perovskite material may be optionally located between the first bottom junction layer 130 and the first top junction layer 134. As shown, the hybrid solar cell plate 100 includes a step surface including a floor 194 and a step edge 192 that extends from the floor 194 and across a thickness of the top subcell 220.

As shown, the solar cell 125 is a tandem solar cell structure including both a top subcell 220 and bottom subcell 210. While the top subcell 220 and the bottom subcell 210 may be formed of the same or similar materials, in a particular embodiment, the top subcell 220 includes a perovskite absorber layer 132, and the bottom subcell 210 is silicon-based. In the illustrated embodiment, the step edge 192 extends across a thickness of additional layers such as a recombination layer 120 (e.g. TCO) and the top electrode layer 140 (e.g. TCO). In the particular embodiment illustrated the step edge 192 extends across a thickness of the second top junction layer 112, which is of the second carrier type. For example, the second top junction layer 112 may be n-doped (e.g. n+ doped) silicon. The second bottom junction layer 110 may be p-doped silicon.

In the illustrated embodiment, the top subcell 220 has a p-i-n geometry (first layer is fabricated first), while the bottom subcell 210 has a p-n geometry. As described elsewhere herein the bottom subcell 210 can additionally include intrinsic layers for a for heterojunction (HTJ) design. In an embodiment, an optional n++ silicon layer (not illustrated) and passivation layer (not illustrated) are formed between the second top junction layer 112 and the recombination layer 120. In the illustrated embodiment, the second bottom junction layer 110 is formed of a p-type silicon substrate, or bulk wafer. While not required, the second bottom junction layer 110 may be thicker than other subcell layers as a result and may provide physical robustness to the hybrid solar cell plate 100.

A bypass diode 175 can be formed over the floor 194 and laterally adjacent to the step edge 192. The bypass diode 175 may be electrically (and laterally) separated from the step edge 192 by an insulating material 115 or gap. The bypass diode 175 can be formed of similar materials as the top subcell 220, or different materials. For example, the bypass diode can include an HTL and ETL, or be a Schottky diode including a metal and doped semiconductor material. In the embodiment illustrated, the bypass diode 175 includes one or more optional contact layers 160 that may be directly on the floor 194 and exposed second bottom junction layer 110. The optional contact layer 160 can make ohmic contact with the second bottom junction layer 110, and hence in electrical connection with the bottom electrode layer 102 spanning underneath the bypass diode 175. The optional contact layer 160 may be formed of amorphous silicon for example, or other suitable material. A bottom bypass electrode 162 may be formed over the floor 194 and optional contact layer 160. For example, the bottom bypass electrode 162 may be formed of a TCO. A bottom bypass junction layer 170 (e.g. ETL) may be formed over the bottom bypass electrode 162, followed by a top bypass junction layer 180 (e.g. HTL) and optional top contact layer 190 (e.g. TCO). Thicknesses of the various layers within the bypass diode 175 may be adjusted to form a level surface with the top electrode layer 140. An optional insulator material 115 may fill the gap laterally between the top subcell 220 and the bypass diode 175 stack-up. The optional insulator material 115 may be formed of a suitable material such as oxide or polymer.

In accordance with embodiments, the bypass diode 175 and step edge 192 may be located adjacent to and parallel to a peripheral edge 107 of the hybrid solar cell plate 100. For example, with a rectangular plate arrangement the peripheral edge may be opposite an opposing edge 103, and orthogonal to connecting edges 105 (see FIGS. 6A-6C). Still referring to FIG. 2, a patterned metal layer 150 spans over the solar cell 125 and bypass diode 175. The patterned metal layer 150 may include one or more layers. In an embodiment, the patterned metal layer 150 includes a plurality of finger electrodes 151 that extend over the solar cell 125, and a metal busbar 152 that connects the plurality of finger electrodes 151. The finger electrodes 151 and metal busbar 152 may be formed of the same metal layer, or different metal layers. In the illustrated embodiment the metal busbar 152 is illustrated as being over the finger electrodes 151. While this is possible, such an illustration is also to provide visualization of the parts, and the metal busbar 152 and finger electrodes 151 may be in the same metal layer, with same thickness. In an embodiment, the metal busbar 152 is substantially (or entirely) located over the floor 194 and/or bypass diode 175 stack-up. In this manner the amount of light that is blocked from the solar cell 125 by the patterned metal layer 150 can be mitigated.

In accordance with embodiments, the top subcell 220 and optional bottom subcell 210 for tandem structures are a portion of the only solar cell 125 of the hybrid solar cell plate 100. Likewise the bypass diode 175 is the only bypass diode of the solar cell plate 100. Depending upon the solar cell 125 stack-up the bypass diode 175 can bypass one or more, or all, of the subcells. In order to form a module the hybrid solar cell plates 100 may be serially connected to one another.

Figure 3:
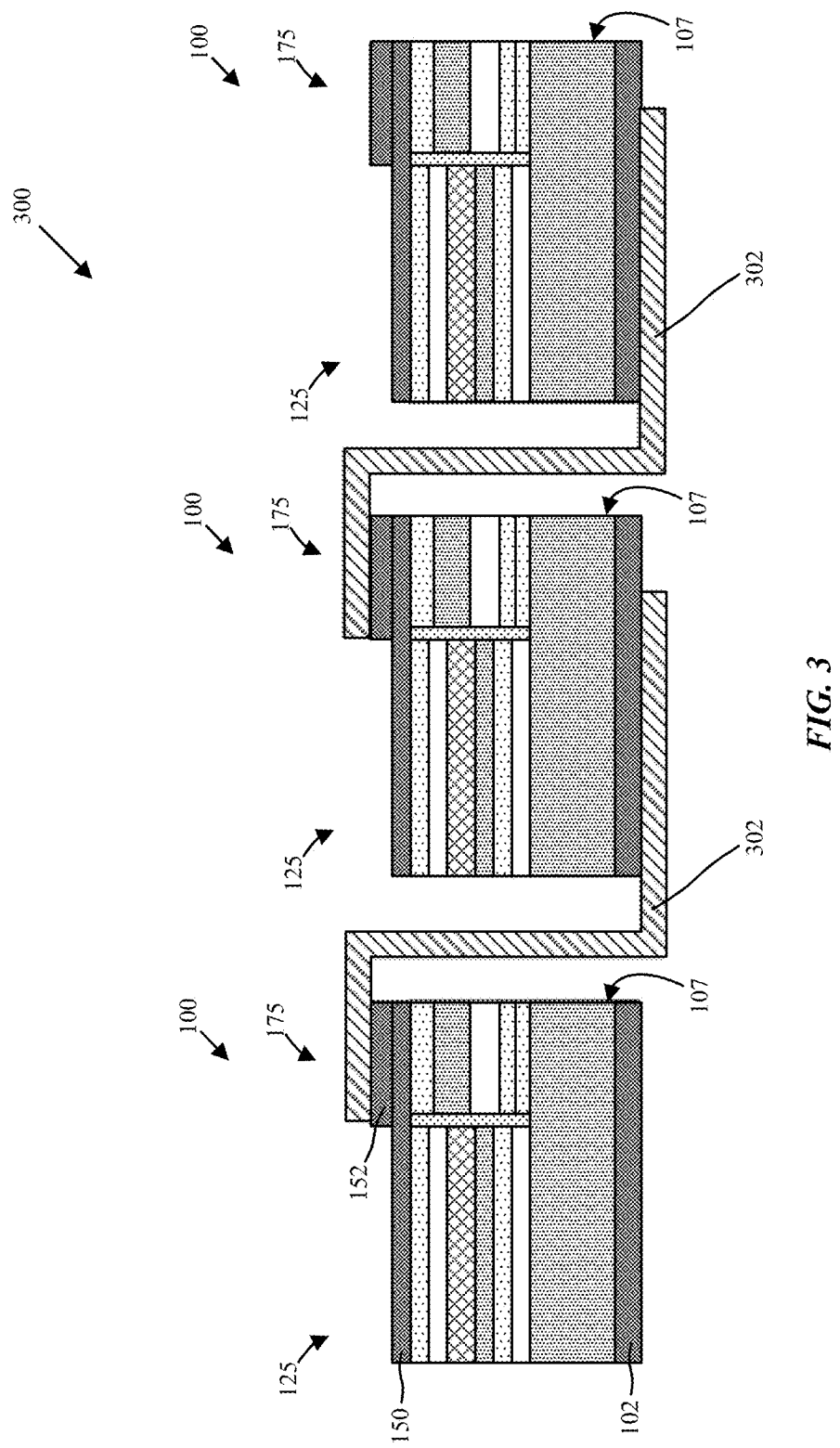
FIG. 3 is a schematic cross-sectional side view illustration of a solar module including a plurality of serially connected hybrid solar cell plates with integrated bypass diodes in accordance with an embodiment.

FIG. 3 is a schematic cross-sectional side view illustration of a solar module 300 including a plurality of serially connected hybrid solar cell plates 100 with integrated bypass diodes in accordance with an embodiment. For convenience, the solar module 300 of FIG. 3 illustrates serially connected hybrid solar cell plates 100 of FIG. 2, however it is to be appreciated that this is merely exemplary and that the solar module 300 can include any of the hybrid solar cell plates 100 described herein. As shown, the hybrid solar cell plates 100 are connected front to back with serial connection between the metal busbars 152 and bottom electrode layer 102. Connection may be made with a ribbon or wiring 302. Alternatively, the hybrid solar cell plates 100 can be stacked front-to-back. In both configurations, the ribbon or wiring 302, or front-to-back stacking can be made over the metal busbar 152 so that the solar cell 125 is not blocked by the ribbon or wiring 302, or the stacked hybrid solar cell plate 100.

In an embodiment, a solar module 300 includes a first hybrid solar cell plate 100 including a first top subcell, a first step surface including a first floor and a first step edge extending from the first floor across a first thickness of the first top subcell, a first bypass diode 175 over the first floor, a first metal finger pattern spanning over the first top subcell. a first metal busbar over the first bypass diode, and a first bottom electrode layer. The solar module 300 additionally includes a second hybrid solar cell plate 100 including a second top subcell, a second step surface including a second floor and a second step edge extending from the second floor across a second thickness of the second top subcell, a second bypass diode over the first floor, a second metal finger pattern spanning over the second top subcell, a second metal busbar over the second bypass diode, and a second bottom electrode layer. In accordance with embodiments, the first metal busbar is connected to the second bottom electrode layer. For example, a ribbon or wiring 302 can be used for the connection. Furthermore, the ribbon or wiring 302 can be bonded using a suitable material such as a conductive film, conductive paste, or solder. Alternatively, the first and second hybrid solar cell plates 100 can be stacked front-to-back and bonded using a suitable material such as a conductive film, conductive paste, or solder.

Figure 5A:
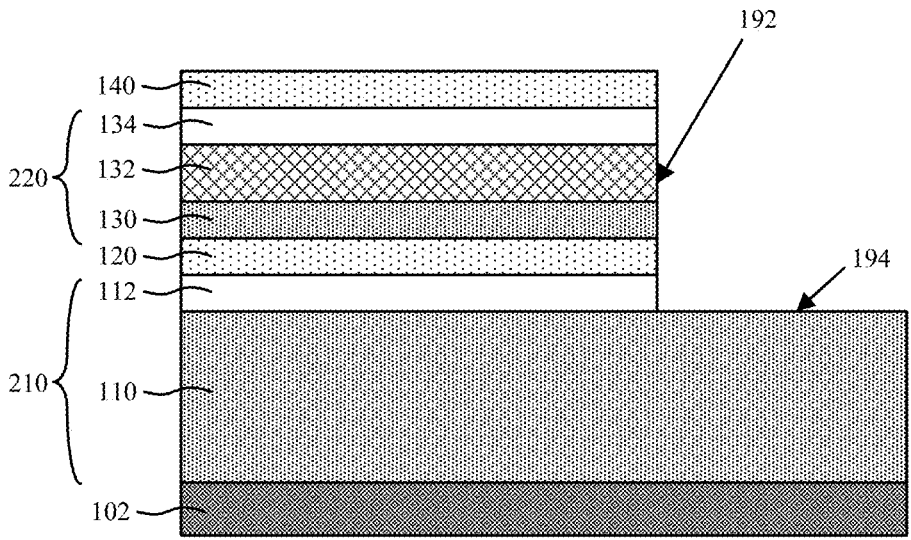
FIGS. 5A-5E are schematic cross-sectional side view illustration of a method of forming a hybrid solar cell plate including a perovskite-silicon tandem solar cell with integrated bypass diode in accordance with an embodiment.

Referring now to FIG. 4 and FIGS. 5A-5E, FIG. 4 is a flow chart for a method of forming a hybrid solar cell plate including a perovskite-silicon tandem solar cell with integrated bypass diode in accordance with an embodiment; FIGS. 5A-5E are schematic cross-sectional side view illustration of a method of forming a hybrid solar cell plate including a perovskite-silicon tandem solar cell with integrated bypass diode in accordance with an embodiment. In interest of clarity and conciseness the method of FIG. 4 is described concurrently with the illustrations of FIGS. 5A-5E. As shown in FIG. 5A the process sequence can begin at operation 4010 with a p-silicon based tandem solar cell fabricated up to the top electrode layer 140. At operation 4020 the perovskite top subcell 220 and the n-type silicon second top junction layer 112 are etched away to form the step surface including the step edge 192 and floor 194. Etching can be accomplished using one or more operations. Suitable etching techniques include wet and dry etching, as well as laser etching. In an embodiment, the entire etching operation can be laser etching. In an embodiment, the top subcell 220 can be etched using a dry etching technique, while the n-type silicon second top junction layer 112 is etches using a laser etching technique. In an alternative process sequence the step surface is formed during deposition, such as with shadow masking. The step surface can also be formed using a combination of shadow masking and laser etching, for example, laser etching of the n-type silicon second top junction layer 112. A variety of techniques may be utilized to form the step surface in accordance with embodiments.

Figure 5B:
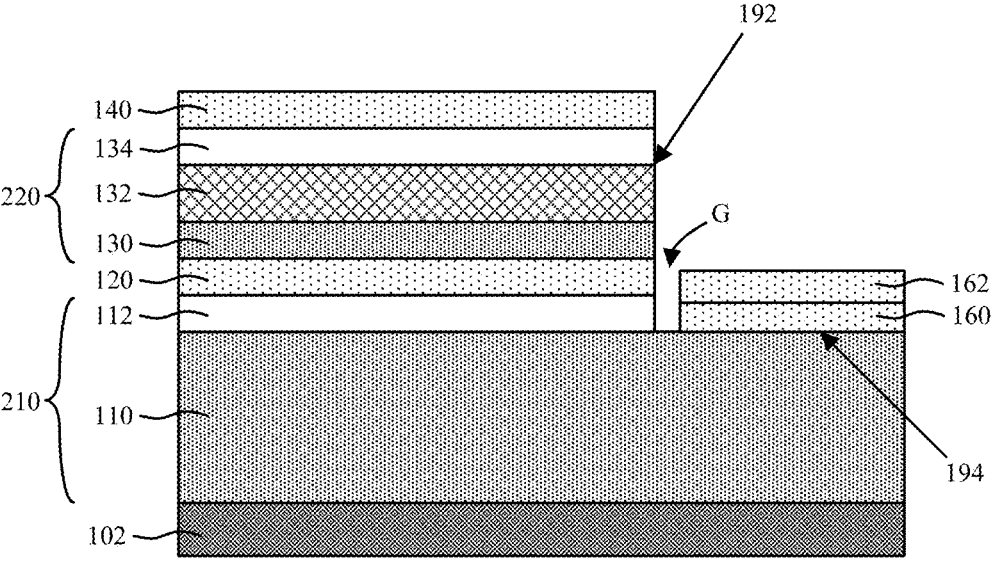
Figure 5C:
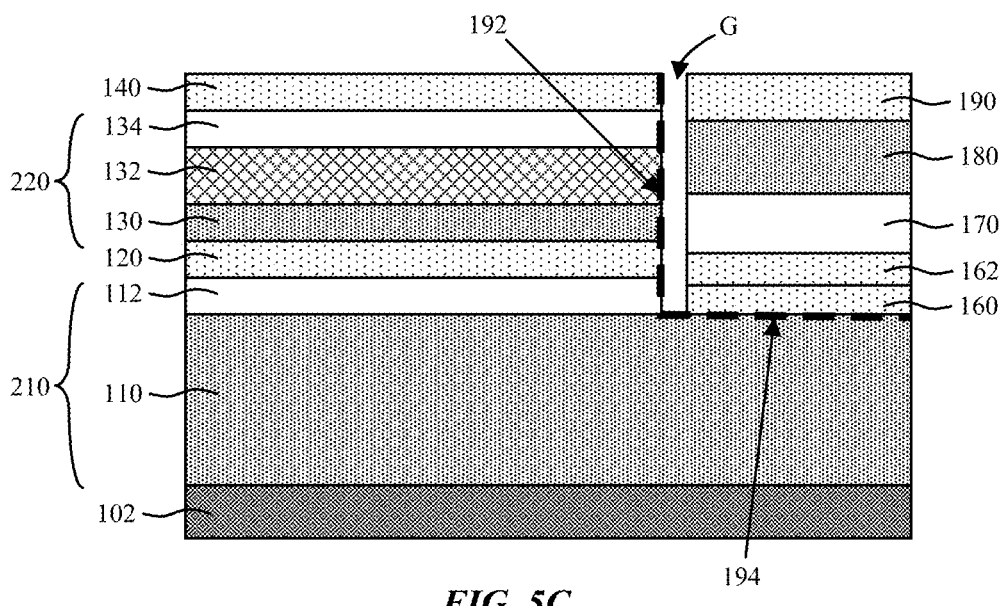
Figure 5D:
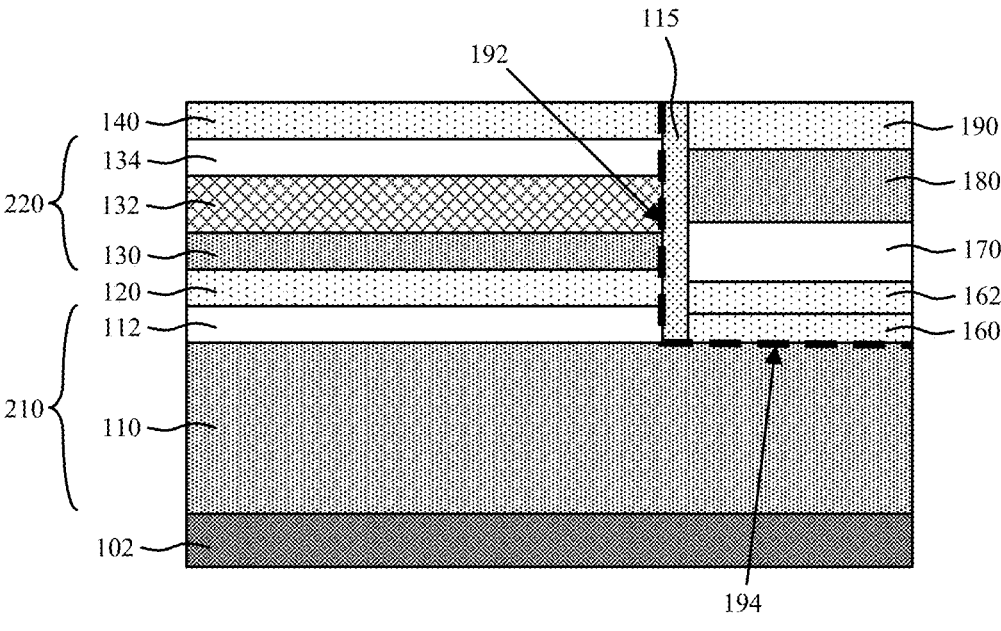
Figure 5E:
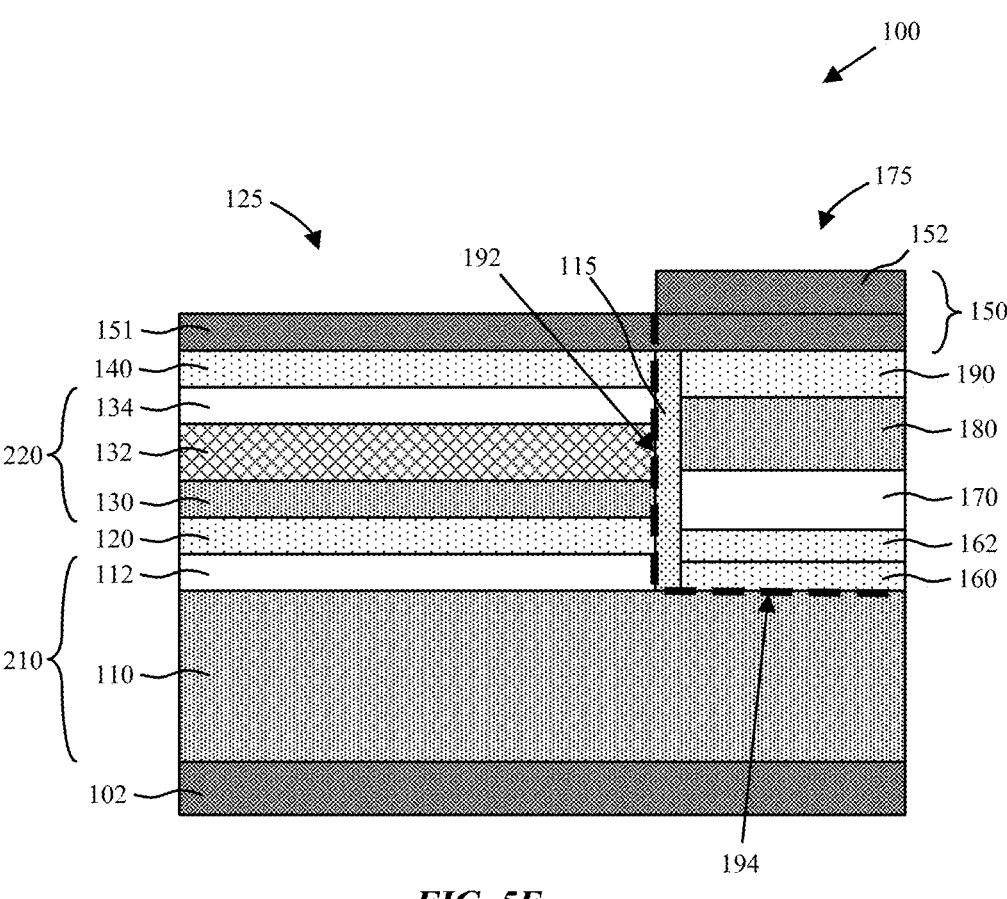

Referring now to FIG. 5B at operation 4030 an optional contact layer 160 and bottom bypass electrode 162 are formed over the step surface floor 194. For example, this may be accomplished with deposition and shadow masking to form a gap (G) laterally between the optional contact layer 160 and bottom bypass electrode 162 and the step edge 192. The additional bypass diode layers can then be deposited at operation 4040, as shown in FIG. 5C using printing approaches or vapor-based deposition, or other suitable technique depending upon materials, while maintaining the gap (G). At operation 4050 the gap (G) is then optionally filled with an insulator material as shown in FIG. 5D using a suitable technique such as printing, slot-die coating, or other solution-based process. This may be followed by the formation of the patterned metal layer 150 at operation 4060 as shown in FIG. 5E.

Figures 6A, 6B:
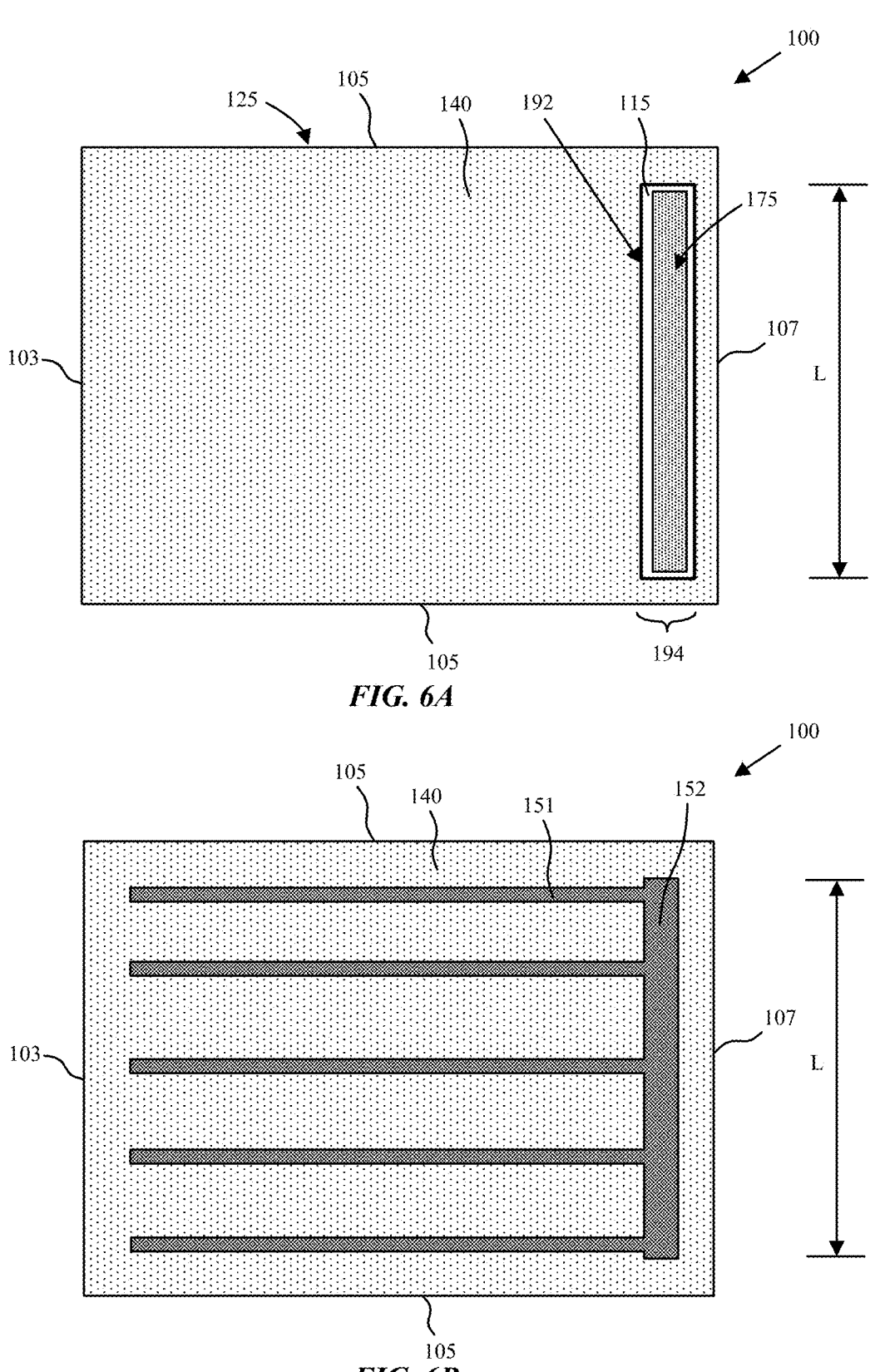
FIG. 6A is a schematic top view illustration of a hybrid solar cell plate with a trench step surface prior to deposition of a patterned metal layer in accordance with an embodiment.
FIG. 6B is a schematic top view illustration of a hybrid solar cell plate with a trench step surface after deposition of a patterned metal layer in accordance with an embodiment.
Figure 6C:
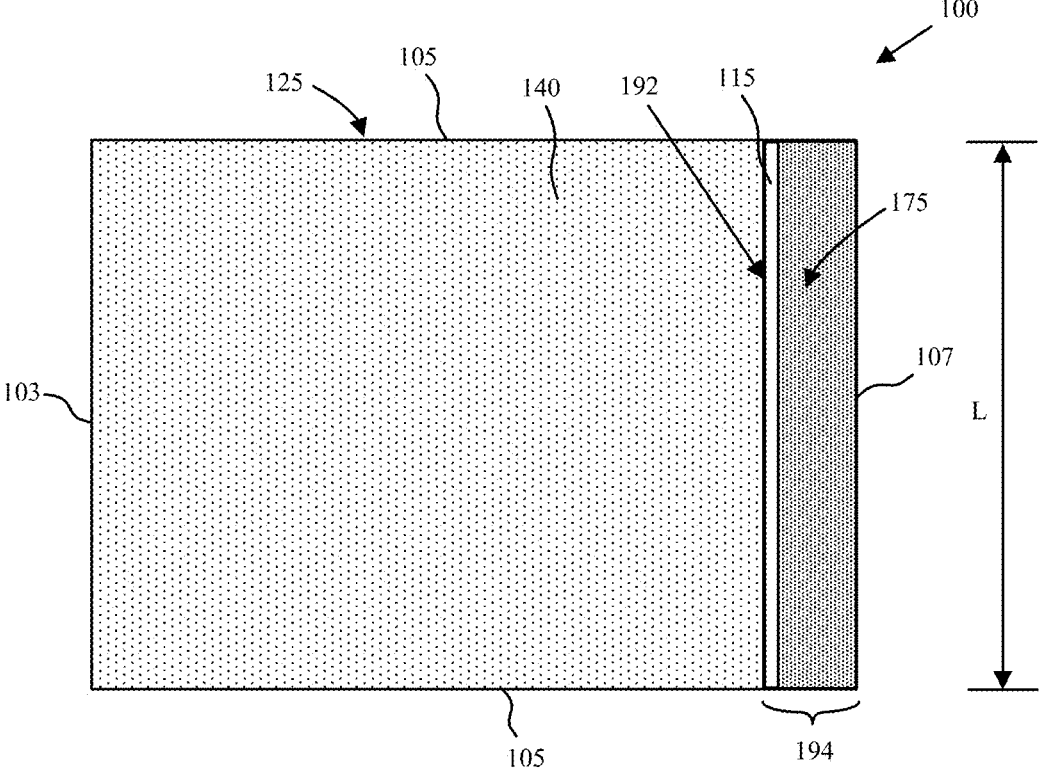
FIG. 6C is a schematic top view illustration of a hybrid solar cell plate with a ledge step surface prior to deposition of a patterned metal layer in accordance with an embodiment.

The patterned metal layer 150 may be formed of a single or multiple layers, and may be formed using suitable deposition techniques with shadow masking in order to avoid etching. Other techniques can be a deposition and photoresist lift-off technique, or deposition and etching. Referring now to FIGS. 6A-6C various schematic top view illustrations are provided to illustrate the relationship of the patterned metal layer 150, step surface, and bypass diode 175 in accordance with embodiments. FIG. 6A is a schematic top view illustration of a hybrid solar cell plate with a trench step surface prior to deposition of a patterned metal layer 150 in accordance with an embodiment. As shown in FIG. 6A, the bypass diode 175 specific layers are formed within a trench shaped step surface, wherein the step edge 192, floor 194 and additional edges form a trench within the stack-up. As shown, the step surface and bypass diode 175 are located laterally adjacent a peripheral edge 107 of the hybrid solar cell plate 100. Specifically, a longitudinal length (L) of the step edge 192 and bypass diode 175 can be parallel to the peripheral edge 107.

FIG. 6B is a schematic top view illustration of a hybrid solar cell plate 100 with a trench step surface after deposition of a patterned metal layer 150 in accordance with an embodiment. As shown, the busbar 152 of the patterned metal layer can be substantially (or entirely) located over the floor 194 and/or bypass diode 175 stack-up. In this manner the amount of light that is blocked from the solar cell 125 by the patterned metal layer 150 can be mitigated. The total area reserved for the finger electrodes 151 can be as much as needed for electrical contact and allowing for light transmission to the solar cell 125.

The step surface in accordance with embodiments can take a variety of configurations in order to accommodate the bypass diode 175. FIG. 6C is a schematic top view illustration of a hybrid solar cell plate 100 with a ledge step surface prior to deposition of a patterned metal layer in accordance with an embodiment. In such an embodiment, the entire floor 194 area can be a ledge area spanning between the step edge 192 and peripheral edge 107 of the hybrid solar cell plate 100. The longitudinal length (L) may run the entire length of the peripheral edge 107 or only a portion thereof.

Up until this point a hybrid solar cell plate 100 with particular solar cell 125 stack-up has been described which includes a tandem solar cell based on a p-doped silicon substrate. It is understood however that the hybrid solar cell plates 100 in accordance with embodiments can assume a variety of configurations, including single subcell structures, multiple subcell structures, and have reversed geometries (e.g. polarities). A variety of possible configurations are envisioned. In the following description of FIGS. 7-17 such variations are described and illustrated in order to apply the embodiments to different subcell stacks and polarities. Accordingly, such description and illustration is intended to be exemplary, and non-limiting. It is to be further appreciated that the structural relationships illustrated in various figures may be shared among several of the possible variations. Accordingly, may shared features are not not repeatedly described in order to not overly obscure the embodiments.

Figure 7:
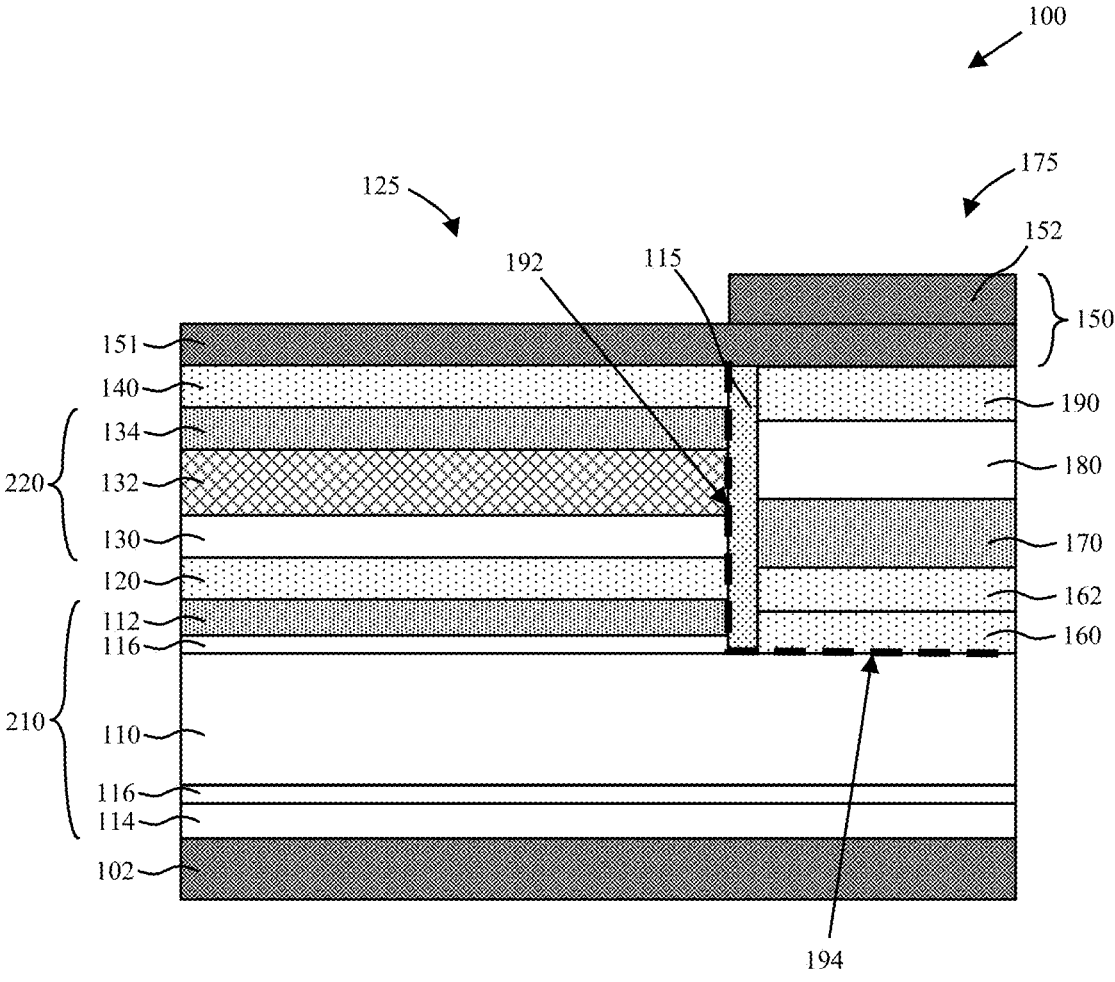
FIG. 7 is a schematic cross-sectional side view illustration of a hybrid solar cell plate including an n-silicon based perovskite-silicon tandem solar cell with n-i-p perovskite geometry with integrated bypass diode to both subcells in accordance with an embodiment.

FIG. 7 is a schematic cross-sectional side view illustration of a hybrid solar cell plate including an n-silicon based perovskite-silicon tandem solar cell with n-i-p perovskite geometry with integrated bypass diode to both subcells in accordance with an embodiment. The geometry of the hybrid solar cell plate 100 of FIG. 7 is substantially similar to that previously described and illustrated with regard to FIG. 2, with reversed polarities. Similarly, the bypass diodes 175 of FIG. 2 and FIG. 7 bypass both subcells of the solar cells 125. Rather than beginning the fabrication process with a p-silicon substrate as with the embodiment illustrated in FIG. 2, the embodiment illustrated in FIG. 7 may begin the fabrication process with an n-silicon substrate. As shown in FIG. 7, the hybrid solar cell plate 100 includes a top subcell 220 and a bottom subcell. The top subcell can include an n-i-p geometry (first layer is fabricated first), while the bottom subcell 210 has an n-p geometry. Thus, the first bottom junction layer 130 of a first carrier type can be an ETL, while the first top junction layer 134 of a second carrier type can be an HTL.

In the particular embodiment illustrated the step edge 192 extends across a thickness of the second top junction layer 112, which is of the second carrier type. For example, the second top junction layer 112 may be p-doped silicon. The second bottom junction layer 110 may be n-doped silicon. An additional bottom junction layer 114 of the first carrier type (e.g. n-type, electrons) can be located between the bottom electrode layer 102 and the second bottom junction layer 110 of the first carrier type. For example, the additional bottom junction layer 114 may be n-doped silicon, or n+ doped silicon. The second top junction layer 112 may be crystalline or amorphous, such as with an HJT design. In such an HJT design the additional bottom junction layer 114 may also be amorphous. Intrinsic layers 116 (e.g. intrinsic silicon) may be formed between the layers and top/bottom sides of the second bottom junction layer 110. For example, this may be achieved by treating a p-silicon substrate, which becomes the second bottom junction layer 110.

As shown, the carrier types of the bypass diode layers may also change. Relative to FIG. 2. In the embodiment illustrated in FIG. 7, bottom bypass junction layer 170 may be an HTL, while the top bypass junction layer 180 may be an ETL. Furthermore, the step surface floor 194 may be formed (e.g, etched) through the top intrinsic layer 116 to expose the second bottom junction layer 110. Additionally, the bottom bypass junction layer 170 may be an HTL, with the top bypass junction layer 180 being an ETL for a p-n geometry.

Figure 8:
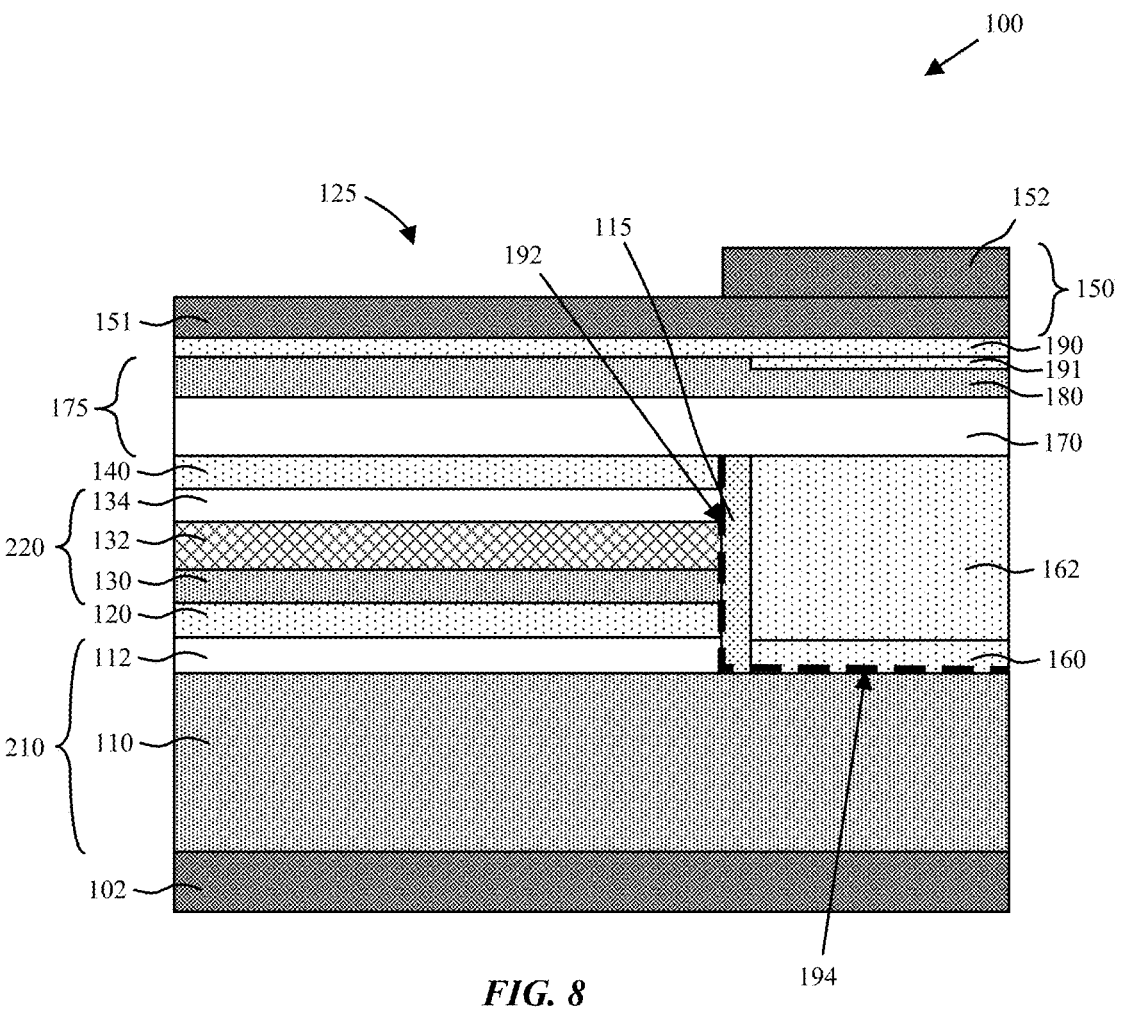
FIG. 8 is a schematic cross-sectional side view illustration of a hybrid solar cell plate including a p-silicon based perovskite-silicon tandem solar cell and overlying integrated bypass diode to both subcells in accordance with an embodiment.

FIG. 8 is a schematic cross-sectional side view illustration of a hybrid solar cell plate 100 including a p-silicon based perovskite-silicon tandem solar cell and overlying integrated bypass diode 175 to both subcells in accordance with an embodiment. Such a configuration may be implemented for example where a larger area bypass diode 175 is needed in order to pass enough current. In such an embodiment the bypass diode 175 can be formed over a portion of the solar cell 125 area, and just the contacts are underneath the metal busbar 152 within the step surface and laterally adjacent to the top and bottom subcells.

The solar cell 125 stack-up of FIG. 8 is substantially similar to that previously described and illustrated with regard to FIG. 2. A significant difference is that the bypass diode 175 is not confined to the step surface area. In the embodiment illustrated, the step surface including the step edge 192 and floor 194 is formed similarly as described with regard to FIG. 2. An optional contact layer 160 is then formed on the floor 194, optionally followed by a bottom bypass electrode 162, which can substantially fill the remainder of the height of the step edge 192. The bottom bypass electrode 162 is optional, and it is not necessary to fill the step surface. The junction layers of the bypass diode 175 include the bottom bypass junction layer 170 (e.g. ETL) and top bypass junction layer 180 (e.g. HTL). Depending upon the thickness of the optional bottom bypass electrode 162, the junction layers of the bypass diode 175 may be over the top of the step edge 192, or may span into the step surface volume and be laterally adjacent the step edge 192. An optional top contact layer 191 (which may be similarly formed as the optional contact layer 160) can be formed over the top bypass junction layer 180 directly over the step surface floor 194. This can be followed by the formation of the top contact layer 190, and patterned metal layer 150.

Figures 9A, 9B:
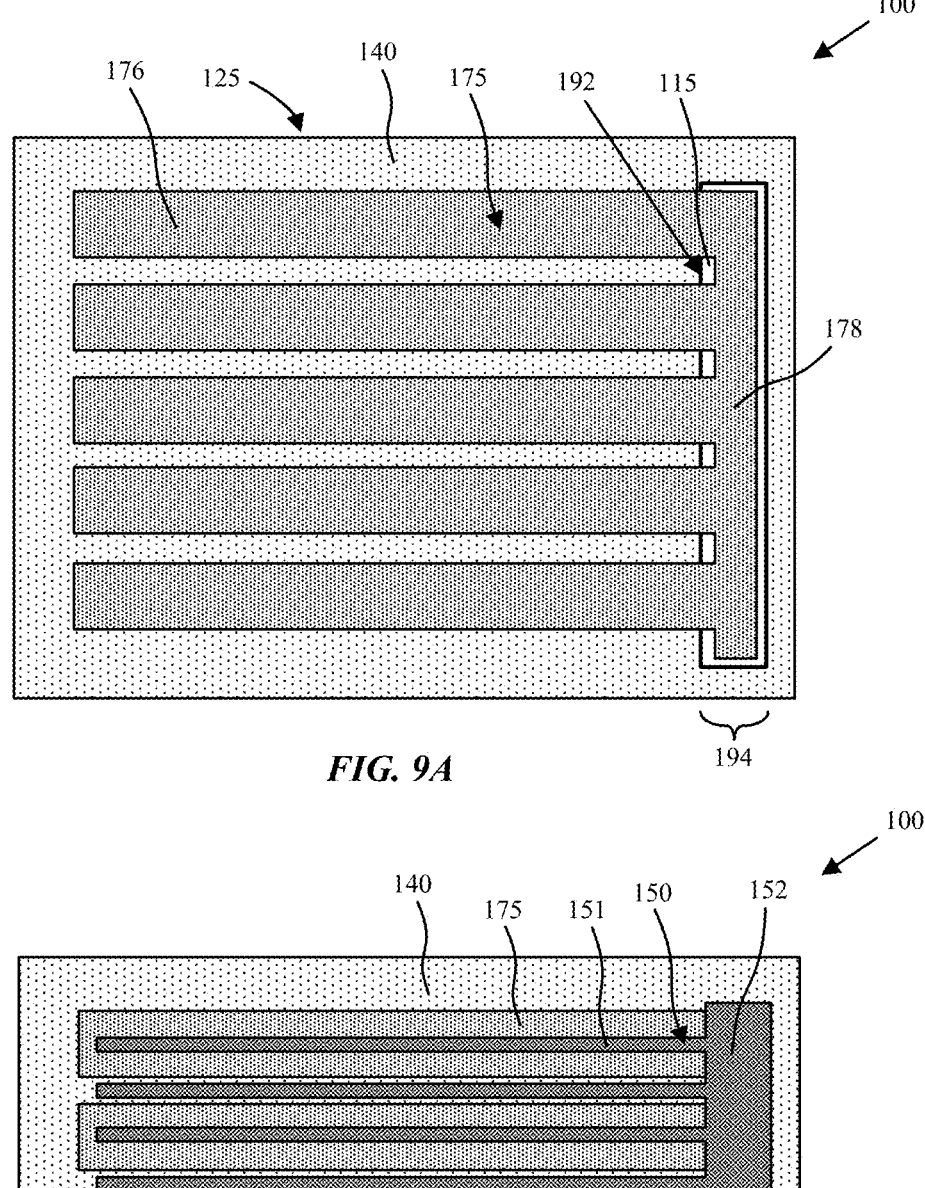
FIG. 9A is a schematic top view illustration of a hybrid solar cell plate prior to deposition of the patterned metal layer in accordance with an embodiment.
FIG. 9B is a schematic top view illustration of a hybrid solar cell after deposition of the patterned metal layer in accordance with an embodiment.

In an embodiment the top contact layer 190 is globally deposited, and may overlap any underlying structures not covered with the bypass diode 175 layers. Alternatively, the top contact layer 190 can be deposited only over the bypass diode 175 layers. FIG. 9A is a schematic top view illustration of a hybrid solar cell plate prior to deposition of the patterned metal layer 150 in accordance with an embodiment. Similar to the description of FIG. 6A, the bypass diode 175 layers can be deposited over the floor 194 of the step surface, and the bypass diode 175 layers may additionally substantially cover the floor 194. Since the step surface is already substantially filled with the bottom bypass electrode 162 and insulating material 115, the bypass diode 175 is actually deposited above the step surface, and additionally can span over a portion of the solar cell 125 area. In the illustrated embodiment, the bypass diode 175 layer includes fingers 176 extending away from a busbar 178 of the bypass diode 175.

Referring now to FIG. 9B, a schematic top view illustration is provided of the hybrid solar cell plate 100 of FIG. 9A after deposition of the patterned metal layer 150 in accordance with an embodiment. The patterned metal layer 150 may include a metal busbar 152 and finger electrodes 151 as previously described. In the particular embodiment illustrated, the finger electrodes 151 may include a first group of finger electrodes 151 over an in electrical contact with the fingers 176 of the bypass diode 175, and a second group of finger electrodes 151 over and in electrical contact with the solar cell 125. In this manner different groups of the finger electrodes 151 contact the solar cell 125 and the bypass diode 175 and are both connected to the metal busbar 152, which is positioned over the floor 194 of the step surface.

Up until this point all hybrid solar cell plate 100 structures have included tandem solar cells 125 and bypass diodes 175 that bypass both the top subcell 220 and the bottom subcell 210 of the tandem solar cell 125 stack-ups. In the following embodiments illustrated and described with regard to FIGS. 10-14 the bypass diode 175 may bypass only the top subcell 220 of the hybrid solar cell plate 100.

Figure 10:
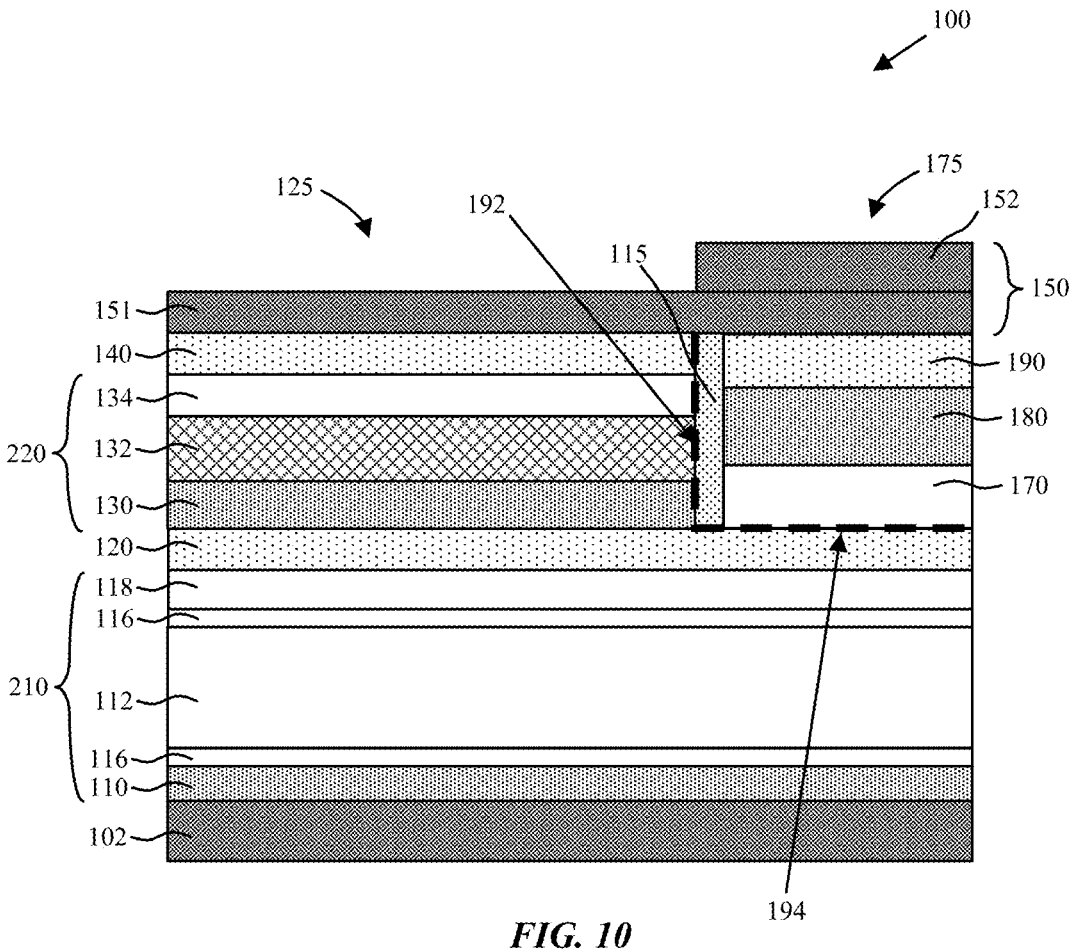
FIG. 10 is a schematic cross-sectional side view illustration of a hybrid solar cell plate including an n-silicon based perovskite-silicon tandem solar cell with integrated bypass diode to the perovskite subcell in accordance with an embodiment.

FIG. 10 is a schematic cross-sectional side view illustration of a hybrid solar cell plate 100 including an n-silicon based perovskite-silicon tandem solar cell with integrated bypass diode to the perovskite subcell in accordance with an embodiment. In the particular embodiment illustrated in FIG. 10 the fabrication sequence can begin with the second top junction layer 112 of second conductivity type, which may be an n-doped silicon substrate. Depending upon fabrication sequence the n-doped silicon substrate can then be processed to form optional intrinsic layers 116 on the top and bottom sides, followed by the formation of the second bottom junction layer 110 of first conductive type (e.g. p-doped silicon) and optionally the additional top junction layer 118, which may be n-doped or n+ doped. For example, the second bottom junction layer 110 and the additional top junction layer 118 can be doped amorphous silicon. In an embodiment, an optional n++ silicon layer (not illustrated) and passivation layer (not illustrated) are formed between the additional top junction layer 118 and the recombination layer 120.

The top subcell 220 may be fabricated similarly as described with FIG. 2. In the embodiment illustrated in FIG. 10, the step surface can be formed with the floor 194 over the recombination layer 120. In the illustrated embodiment the bottom bypass junction layer 170 may be an ETL, with the top bypass junction layer 180 an HTL.

Figure 11:
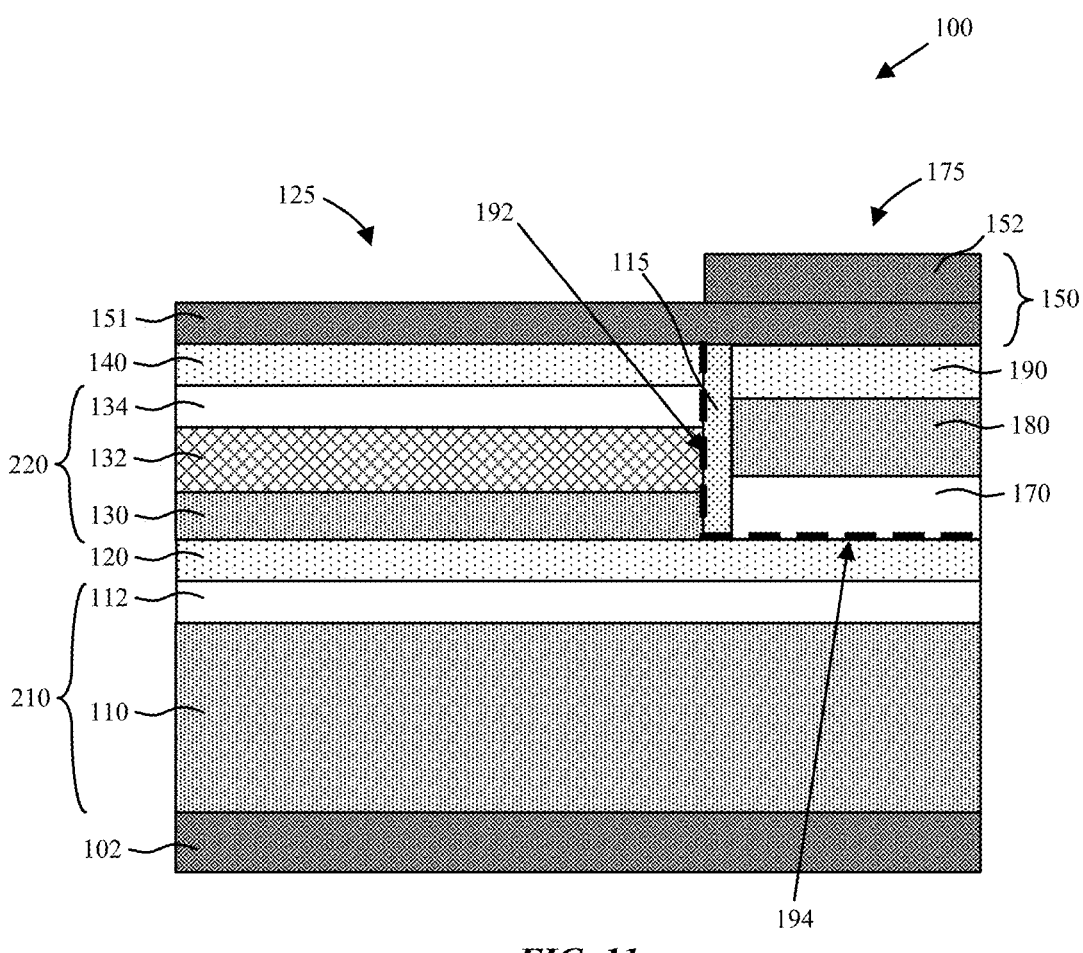
FIG. 11 is a schematic cross-sectional side view illustration of a hybrid solar cell plate including a p-silicon based perovskite-silicon tandem solar cell with integrated bypass diode to the perovskite subcell in accordance with an embodiment.

FIG. 11 is a schematic cross-sectional side view illustration of a hybrid solar cell plate 100 including a p-silicon based perovskite-silicon tandem solar cell with integrated bypass diode to the perovskite subcell in accordance with an embodiment. The particular solar cell 125 stack-up of FIG. 11 is substantially similar to that of FIG. 2, yet the step surface includes a floor 194 that stops on top of the recombination layer 120 similarly as with regard to FIG. 10 such that the bypass diode 175 bypasses only the top subcell 220. In the particular embodiment illustrated, the bottom bypass junction layer 170 may be an ETL, with the top bypass junction layer 180 an HTL.

Figure 12:
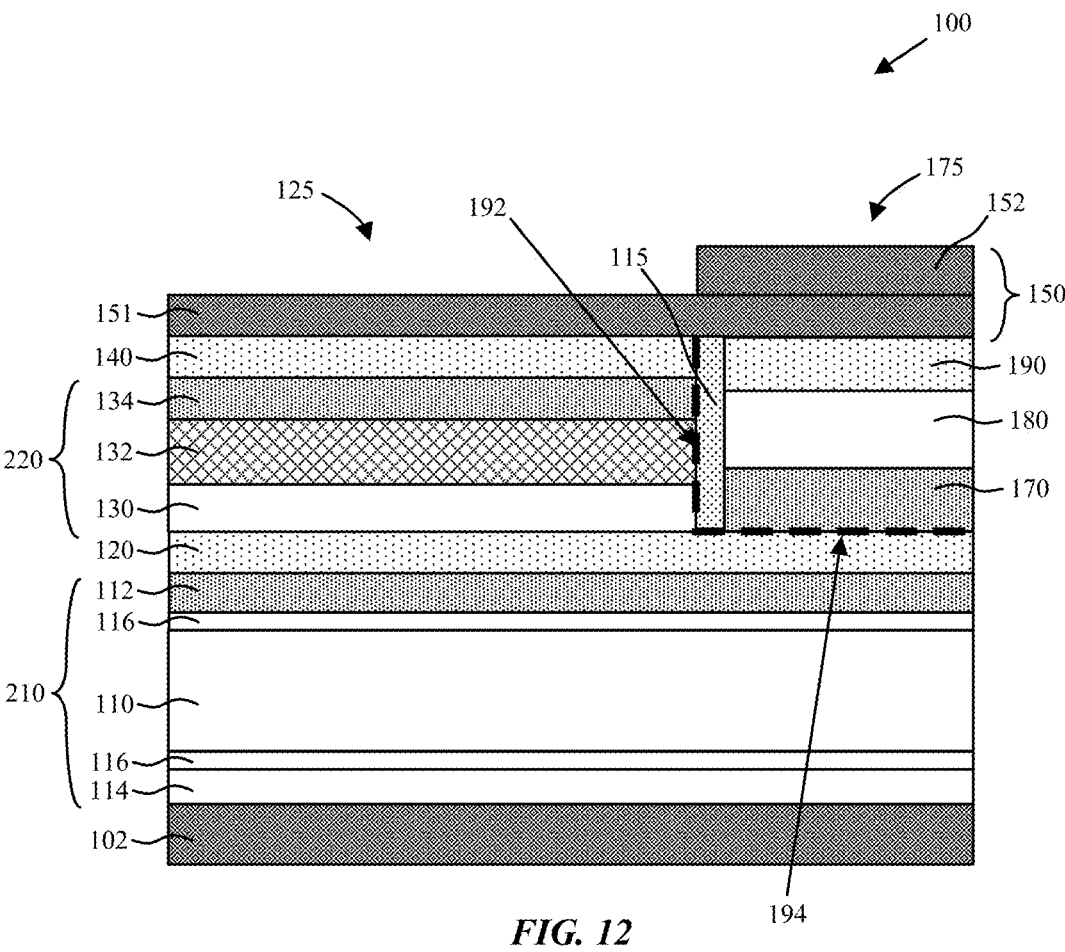
FIG. 12 is a schematic cross-sectional side view illustration of a hybrid solar cell plate including an n-silicon based perovskite-silicon tandem solar cell with integrated bypass diode to the perovskite subcell in accordance with an embodiment.

FIG. 12 is a schematic cross-sectional side view illustration of a hybrid solar cell plate 100 including an n-silicon based perovskite-silicon tandem solar cell with integrated bypass diode to the perovskite subcell in accordance with an embodiment. The particular solar cell 125 stack-up of FIG. 12 is substantially similar to that of FIG. 10, with the polarities reversed. In the particular embodiment illustrated in FIG. 12 the fabrication sequence can begin with the second bottom junction layer 110 of first conductivity type, which may be an n-doped silicon substrate. Depending upon fabrication sequence the n-doped silicon substrate can then be processed to form optional intrinsic layers 116 on the top and bottom sides, followed by the formation of the second top junction layer 112 of second conductive type (e.g. p-doped silicon) and optionally the additional bottom junction layer 114, which may be n-doped or n+ doped. For example, the second top junction layer 112 and the additional bottom junction layer 114 can be doped amorphous silicon.

The top subcell 220 may also have opposite polarities of FIG. 10. In the embodiment illustrated in FIG. 12, the step surface can be formed with the floor 194 over the recombination layer 120. In the illustrated embodiment the bottom bypass junction layer 170 may be an HTL, with the top bypass junction layer 180 an ETL.

Figure 13:
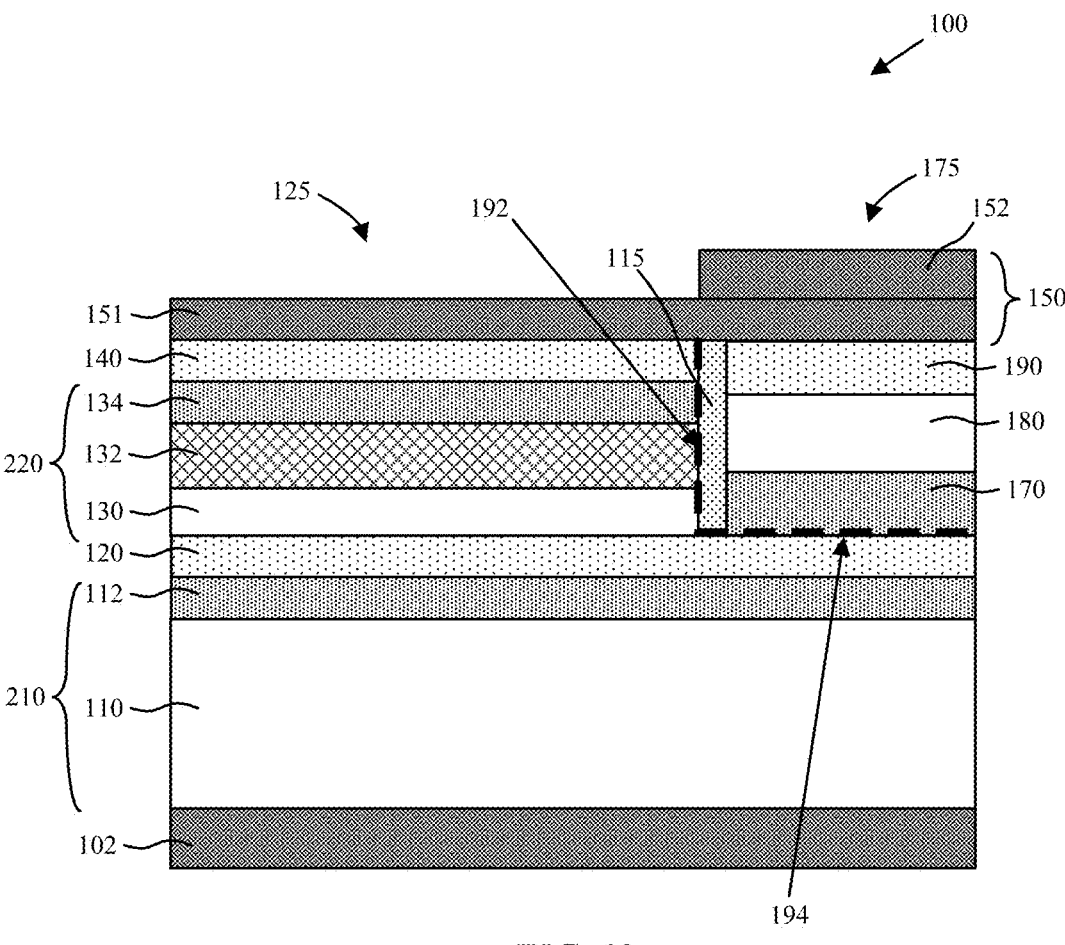
FIG. 13 is a schematic cross-sectional side view illustration of a hybrid solar cell plate including an n-silicon based perovskite-silicon tandem solar cell with integrated bypass diode to the perovskite subcell in accordance with an embodiment.

FIG. 13 is a schematic cross-sectional side view illustration of a hybrid solar cell plate 100 including an n-silicon based perovskite-silicon tandem solar cell with integrated bypass diode to the perovskite subcell in accordance with an embodiment. The particular solar cell 125 stack-up of FIG. 13 is substantially similar to that of FIG. 11, with the polarities reversed. In the particular embodiment illustrated in FIG. 13 the fabrication sequence can begin with the second bottom junction layer 110 of first conductivity type, which may be an n-doped silicon substrate. The second top junction layer 112 may be p-doped silicon. Likewise, the first bottom junction layer 130 may be an ETL, while the first top junction layer 134 may be an HTL. The bypass diode 175 may also have reversed polarities compared to FIG. 11, with the bottom bypass junction layer 170 being an HTL, with the top bypass junction layer 180 being an ETL.

Figure 14:
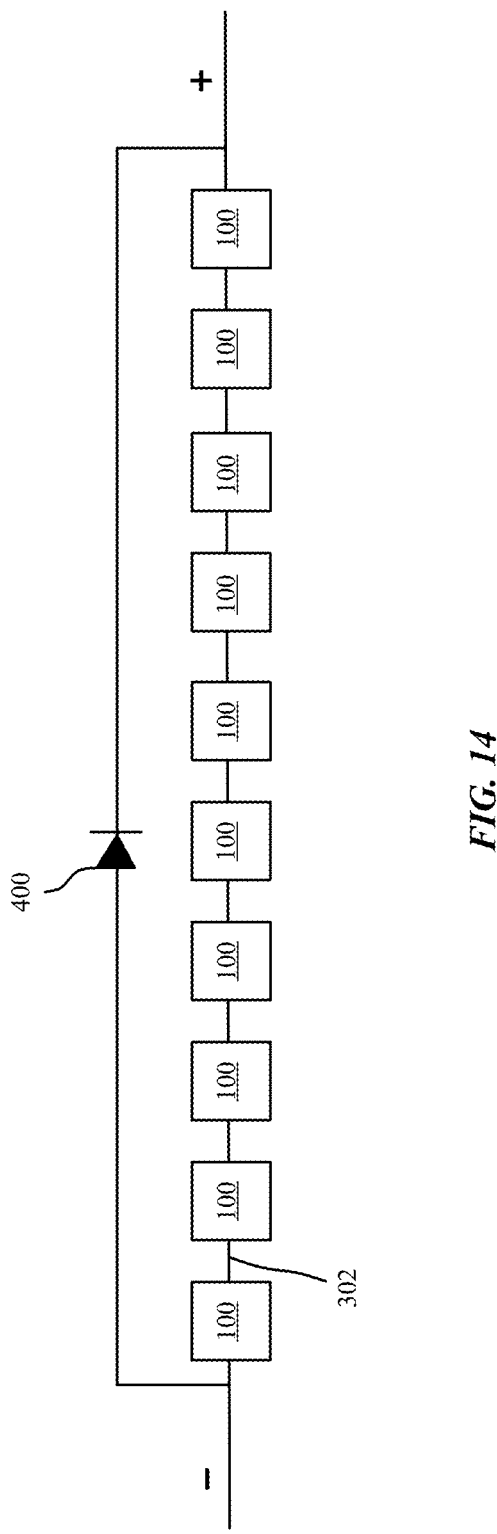
FIG. 14 is a schematic view illustration of an external bypass diode connected to a string of hybrid solar cell plates in accordance with an embodiment.

Referring now to FIG. 14 a schematic view illustration is provided for an external bypass diode 400 connected to a string of hybrid solar cell plates 100 in accordance with an embodiment. In particular, the hybrid solar cell plate 100 of FIG. 14 may be the hybrid solar cell plates 100 of FIGS. 10-14 in which the bypass diodes 175 bypass only the top subcells 220 of the hybrid solar cell plates 100. More specifically, the top subcells 220 may include perovskite absorber layers 132, and silicon-based bottom subcells 210. In this scheme, the bypass diodes 175 protect only the top subcells 220 (for example, when partially shaded). In order to protect the silicon-based bottom subcells 210 an external bypass diode 400 is employed for every "n" hybrid solar cell plates 100 in the module. Silicon has a higher reverse breakdown voltage, so "n" in accordance with embodiments may be small enough so that all solar cells 125 in the serially connected string do not generate a voltage higher than the silicon breakdown voltage.

Up until this point all hybrid solar cell plate 100 structures have included tandem solar cells 125 and bypass diodes 175 that one or both of the tandem solar cell 125 stack-ups. In accordance with embodiments, the hybrid solar cell plate 100 structures can also include bypass diodes 175 integrated with single junction solar cells 125. In the following embodiments illustrated and described with regard to FIGS. 15-17 the solar cells 125 may include a single junction, or top subcell 220.

Figure 15:
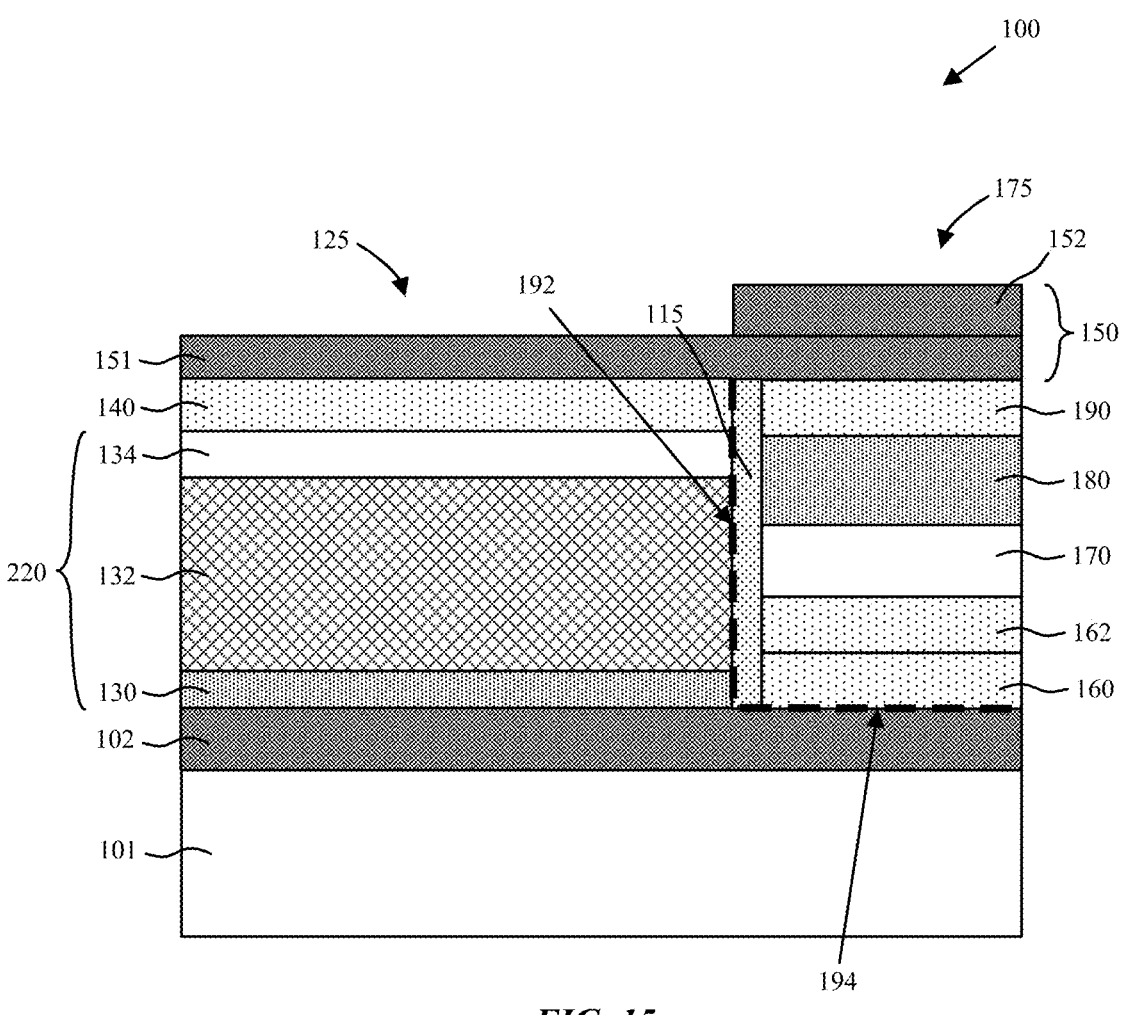
FIG. 15 is a schematic cross-sectional side view illustration of a hybrid solar cell plate including a single junction perovskite solar cell with integrated bypass diode in accordance with an embodiment.

FIG. 15 is a schematic cross-sectional side view illustration of a hybrid solar cell plate 100 including a single junction perovskite solar cell with integrated bypass diode in accordance with an embodiment. The solar cell 125 may be similar to that illustrated and described with regard to FIG. 1A. In the illustrated embodiment the hybrid solar cell plate 100 includes an optional substrate 101, a bottom electrode layer 102, a top electrode layer 140 and a top subcell 220. The top subcell 220 may include a first bottom junction layer 130 of a first carrier type (e.g. HTL) and a first top junction layer 134 of a second carrier type (e.g. ETL) opposite the first carrier type. An absorber layer 132 such as a perovskite material may be optionally located between the first bottom junction layer 130 and the first top junction layer 134. While not shown, the solar cell 125 may include a buffer layer 136 as illustrated in FIG. 1A. As shown in FIG. 15, the hybrid solar cell plate 100 includes a step surface including floor 194 and a step edge 192 that extends from the floor 194 and across a thickness of the top subcell 220. The floor 194 may expose the bottom electrode layer 102.

Similar to the description of FIG. 2, the bypass diode can include an optional contact layer 160, bottom bypass electrode 162, a bottom bypass junction layer 170 (e.g. ETL), a top bypass junction layer 180 (e.g. HTL) and optional top contact layer 190 (e.g. TCO). Thicknesses of the various layers within the bypass diode 175 may be adjusted to form a level surface with the top electrode layer 140. An optional insulator material 115 may fill the gap laterally between the top subcell 220 and the bypass diode 175 stack-up. The optional insulator material 115 may be formed of a suitable material such as oxide or polymer. The patterned metal layer 150 may be formed as previously described.

In the particular embodiment illustrated in FIG. 15, the substrate 101 may provide physical robustness to the hybrid solar cell plate 100. For example, this may be provided when the solar cell 125 is based upon a perovskite or organic absorber layer 132. In other embodiments, the bottom junction layer 110 may function to provide both the physical robustness to the hybrid solar cell plate 100 and also as a conduit for electrical connection of the bypass diode 175 to the bottom electrode layer 102.

Figure 16:
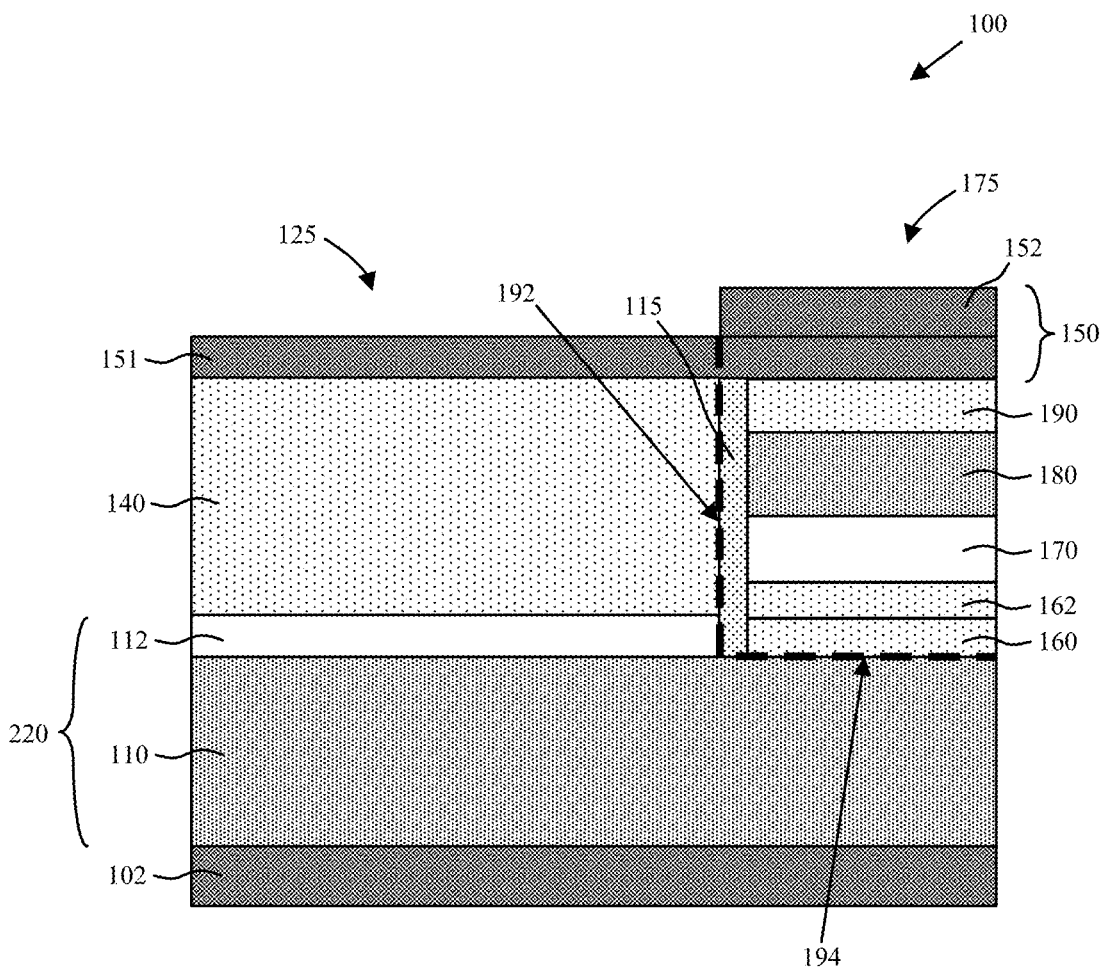
FIG. 16 is a schematic cross-sectional side view illustration of a hybrid solar cell plate including a single junction p-silicon based solar cell with integrated bypass diode in accordance with an embodiment.

Referring now to FIG. 16 a schematic cross-sectional side view illustration is provided of a hybrid solar cell plate 100 including a single junction p-silicon based solar cell 125 with integrated bypass diode 175 in accordance with an embodiment. The solar cell 125 may be similar to that illustrated and described with regard to FIG. 1B. In the illustrated embodiment the hybrid solar cell plate 100 includes a step surface in which the floor 194 exposes the bottom junction layer 110, which may be a p-silicon substrate similarly as described with regard to FIG. 2. The bypass diode 175 may also be formed similarly as described with regard to FIG. 2. Likewise, the patterned metal layer 150 may be formed similarly as described with regard to FIG. 2.

Figure 17:
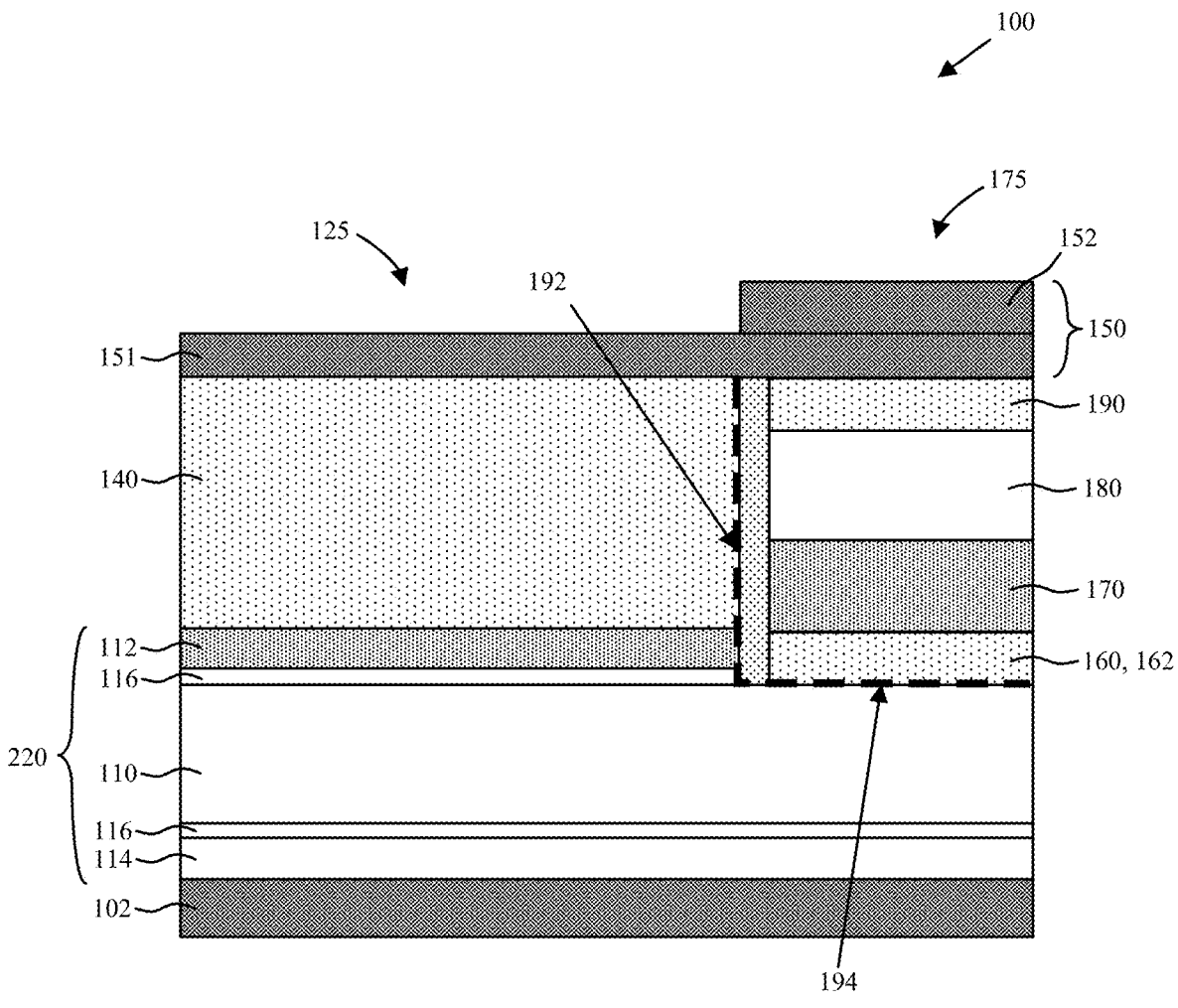
FIG. 17 is a schematic cross-sectional side view illustration of a hybrid solar cell plate including a single junction n-silicon based solar cell with integrated bypass diode in accordance with an embodiment.

Referring now to FIG. 17 a schematic cross-sectional side view illustration is provided of a hybrid solar cell plate 100 including a single junction n-silicon based solar cell 125 with integrated bypass diode 175 in accordance with an embodiment. Thus, the fabrication sequence to form the structure of FIG. 17 may begin with an n-silicon substrate, which is the bottom junction layer 110 of first conductivity type (e.g. a n-doped silicon layer for electron conductivity). The top subcell 220 of FIG. 17 may be formed similarly as the bottom subcell 210 of FIG. 7. The top electrode layer 140 however may be thicker, so that the step surface including the step edge 192 is thick enough to accommodate the bypass diode layers on the floor 194. As shown, the bypass diode 175 can include an optional contact layer 160, bottom bypass electrode 162, bottom bypass junction layer 170 (e.g. HTL), top bypass junction layer 180 (e.g. ETL), and top contact layer 190 as previously described.

In utilizing the various aspects of the embodiments, it would become apparent to one skilled in the art that combinations or variations of the above embodiments are possible for forming hybrid solar cell plates with integrated bypass diodes, and solar modules thereof. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A hybrid solar cell plate comprising:
   a bottom electrode layer;
   a top subcell over the bottom electrode layer;
   a step surface including a floor and a step edge extending from the floor and across a thickness of the top subcell;
   a bypass diode spanning over the floor and the top subcell; and
   a patterned metal layer spanning over the bypass diode, wherein the patterned metal layer comprises a plurality of metal finger electrodes spanning over the top subcell.

2. The hybrid solar cell plate of claim 1, wherein the patterned metal layer comprises a metal busbar substantially located over the floor.

3. The hybrid solar cell plate of claim 2, wherein the bypass diode is characterized by a finger and busbar pattern underlying a portion of the plurality of metal finger electrodes and the metal busbar.

4. The hybrid solar cell plate of claim 1, wherein:
   the step edge is adjacent to and parallel to a peripheral edge of the hybrid solar cell plate;
   the top subcell is a portion of an only solar cell of the hybrid solar cell plate; and
   the bypass diode is an only bypass diode of the hybrid solar cell plate.

5. The hybrid solar cell plate of claim 1, further comprising a bottom subcell, wherein:
   the top subcell comprises:
      a first bottom junction layer of a first carrier type; and
      a first top junction layer of a second carrier type opposite the first carrier type; and
   the bottom subcell comprises:
      a second bottom junction layer of the first carrier type; and
      a second top junction layer of the second carrier type opposite the first carrier type.

6. The hybrid solar cell plate of claim 5, wherein the step edge extends across a thickness of the second top junction layer.

7. The hybrid solar cell plate of claim 6, wherein the floor spans over the first bottom junction layer.

8. The hybrid solar cell plate of claim 6, further comprising a bottom bypass electrode on the floor, wherein the bypass diode spans over the bottom bypass electrode.

9. The hybrid solar cell plate of claim 8, wherein the bottom bypass electrode fills a substantial height of the step edge of the step surface.

10. The hybrid solar cell plate of claim 9, further comprising an insulator material that fills a gap laterally between the top subcell and the bottom bypass electrode.

11. The hybrid solar cell plate of claim 5, wherein:
   the second bottom junction layer is p-doped silicon;
   the first bottom junction layer is a hole transport layer;
   the first top junction layer is an electron transport layer; and
   further comprising a perovskite absorber layer between the first bottom junction layer and the first top junction layer.

12. The hybrid solar cell plate of claim 1, further comprising a top transparent electrode layer.

13. A hybrid solar cell plate comprising:
   a bottom electrode layer;
   a top subcell over the bottom electrode layer;
   a top transparent electrode layer over the top subcell;

a step surface including a floor and a step edge extending from the floor and across a thickness of the top subcell and the top transparent electrode layer;

a bypass diode spanning over the floor and the top subcell; and a patterned metal layer spanning over the bypass diode.

14. The hybrid solar cell plate of claim 13, wherein the patterned metal layer spans over the bypass diode and the top transparent electrode layer.

15. The hybrid solar cell plate of claim 14, wherein the patterned metal layer includes a plurality of metal finger electrodes spanning over the top subcell.

16. The hybrid solar cell plate of claim 15, wherein the patterned metal layer includes a metal busbar substantially located over the floor.

17. A solar module comprising:

a first hybrid solar cell plate comprising:

a first bottom electrode layer;

a first top subcell over the first bottom electrode layer;

a first step surface including a first floor and a first step edge extending from the first floor across a first thickness of the first top subcell;

a first bypass diode spanning over the first floor and the first top subcell; and a first patterned metal layer spanning over the first bypass diode, wherein the first patterned metal layer comprises a first plurality of first metal finger electrodes spanning over the first top subcell; and a second hybrid solar cell plate comprising:

a second bottom electrode layer;

a second top subcell over the second bottom electrode layer;

a second step surface including a second floor and a second step edge extending from the second floor across a second thickness of the second top subcell;

a second bypass diode over the second floor and the second top subcell; and a second patterned metal layer spanning over the second bypass diode;

wherein the first patterned metal layer is connected to the second bottom electrode layer, wherein the second patterned metal layer comprises a second plurality of second metal finger electrodes spanning over the second top subcell.

18. The solar module of claim 17, wherein the first patterned metal layer is connected to the second bottom electrode layer with a ribbon or wiring.

19. The solar module of claim 17, wherein the first patterned metal layer is connected to the second bottom electrode layer with a conductive film, conductive paste, or solder.

* * * * *